(12) United States Patent
Udengaard et al.

(10) Patent No.: US 11,409,249 B1
(45) Date of Patent: Aug. 9, 2022

(54) SIMULATING TRANSVERSE MOTION RESPONSE OF A FLEXIBLE ROTOR BASED ON A PARAMETER DEPENDENT EIGENMODES

(71) Applicant: The Mathworks, Inc., Natick, MA (US)

(72) Inventors: Martin Udengaard, Cambridge, MA (US); Jocelyn Kluger, Cambridge, MA (US)

(73) Assignee: The MathWorks, Inc., Natick, MA (US)

( * ) Notice: Subject to any disclaimer, the term of this patent is extended or adjusted under 35 U.S.C. 154(b) by 371 days.

(21) Appl. No.: 16/776,797

(22) Filed: Jan. 30, 2020

(51) Int. Cl.
| | | |
|---|---|---|
| *G05B 13/04* | (2006.01) | |
| *G06F 16/90* | (2019.01) | |
| *G06F 30/20* | (2020.01) | |
| *G06F 30/17* | (2020.01) | |
| *G06F 16/901* | (2019.01) | |

(52) U.S. Cl.
CPC ....... *G05B 13/042* (2013.01); *G06F 16/9017* (2019.01); *G06F 30/17* (2020.01); *G06F 30/20* (2020.01)

(58) Field of Classification Search
None
See application file for complete search history.

(56) References Cited

U.S. PATENT DOCUMENTS

| | | |
|---|---|---|
| 3,069,654 A | 12/1962 | Hough |
| 7,501,782 B2 | 3/2009 | Buhler et al. |
| 10,746,013 B2* | 8/2020 | Hohl ............... F04C 2/107 |
| 10,822,939 B2* | 11/2020 | Hohl ............... E21B 44/00 |
| 2012/0251318 A1* | 10/2012 | Caso Prieto ...... F03D 80/00 416/140 |

(Continued)

OTHER PUBLICATIONS

Tefan et al., "On the Analytical, Numerical and Experimental Models for Determining the Mode Shapes of Transversal Vibrations of a Cantilever Beam", 2020, U.P.B. Sci. Bull., Series D, vol. 82, Iss. 4, 2020 ISSN 1454-2358. (Year: 2020).*

(Continued)

*Primary Examiner* — Mohammad Ali
*Assistant Examiner* — Kelvin Booker
(74) *Attorney, Agent, or Firm* — Goodwin Procter LLP

(57) ABSTRACT

Exemplary embodiments simulate the eigenmodes of a flexible rotor in a model of a rotor and thus reduce the number of variables and computation expense required during simulation of the transverse motion response of the rotor. The exemplary embodiments may use data structures, such as lookup tables, to store precomputed information that may be used for the determining eigenmode properties as the values of one or more parameters affecting the eigenmode properties (e.g., speed, shaft temperature, bearing viscosity, normal force acting along the rotor shaft axis, turbine power level, turbine fluid flow rate, etc.) change during a simulation. The use of the data structures helps to reduce the computational expense during the simulation. The computational expense is reduced because the eigenmode properties need not be calculated dynamically during each simulation run and because there are far fewer variables to represent the transverse motion along the flexible rotor and to indicate vibration and loads during simulation.

31 Claims, 21 Drawing Sheets

(56) References Cited

U.S. PATENT DOCUMENTS

| | | | |
|---|---|---|---|
| 2012/0253697 A1* | 10/2012 | Frankenstein | G05B 23/0254 |
| | | | 702/39 |
| 2013/0324833 A1* | 12/2013 | Barley | A61B 6/466 |
| | | | 600/417 |
| 2014/0334928 A1* | 11/2014 | Baek | F03D 7/043 |
| | | | 416/1 |
| 2015/0006038 A1* | 1/2015 | Gustavsson | B62D 21/152 |
| | | | 701/45 |
| 2016/0348493 A1* | 12/2016 | Hohl | E21B 21/08 |
| 2018/0371889 A1* | 12/2018 | Hohl | E21B 47/12 |
| 2019/0321013 A1* | 10/2019 | Nieminen | A61B 10/0275 |
| 2019/0338482 A1* | 11/2019 | Lund | F16F 7/10 |

OTHER PUBLICATIONS

Eder et al., "A multi-frequency fatigue testing method for wind turbine rotor blades", Mar. 8, 2016, Journal of Sound and Vibration 388 (2017) 123-140. (Year: 2016).*

Stanoev et al., "Determination of natural frequencies and mode shapes of a wind turbine rotor blade using Timoshenko beam elements", Sep. 2018, Wind Energ. Sci., 4, 57-69, 2019. (Year: 2018).*

Jiazhe et al., "A Vibration Damping Analysis Method of Turbine Blade Shroud Dampers Based on a Given Eigen-Mode", Aug. 2018, Proceedings of the ASME 2018 International Design Engineering Technical Conferences and Computers and Information in Engineering Conference IDETC/CIE 2018. (Year: 2018).*

Maywald et al., "Vacuum Spin Test Series of a Turbine Impeller With Focus on Mistuning and Damping by Comparing Tip Timing and Strain Gauge Results", Jun. 2015, Proceedings of ASME Turbo Expo 2015: Turbine Technical Conference and Exposition GT2015. (Year: 2015).*

Peeters et al., "Comparison of analysis techniques for the dynamic behaviour of an integrated drivetrain in a wind turbine", 2002, Proceedings of ISMA2002—vol. III. (Year: 2002).*

Gale, D., & Shapley, L.S., 1962, "College Admissions and the Stability of Marriage", American Mathematical Monthly 69(1):9-14.

Allemang, R., "The Modal Assurance Criterion—Twenty Years of Use and Abuse", Paper presented at IMAC-XX, the 20th International Modal Analysis Conference, Los Angeles, CA (Feb. 2002) 8 pages.

Mogenier, G., et al., "A criterion for mode shape tracking: application to Campbell diagrams", Journal of Vibration and Control, 20(2):179-190 (2014).

Gruber, F.M., & Rixen, D.J., "Dual Craig-Bampton Component Mode Synthesis Method for Model Order Reduction of Nonclassically Damped Linear Systems", Technical University of Munich, Institute of Applied Mechanics, Garching, Germany, 25 pages, Jan. 17, 2018.

Weiler, Bradley, "Finite element method based analysis and modeling in rotordynamics", master's thesis, University of Cincinnati, Cincinnati, OH (2017) 91 pages.

Camporeale, S.M., et al., "A Modular Code for Real Time Dynamic Simulation of Gas Turbines in Simulink", Paper presented at the meeting of the International Gas Turbine and Aeroengine Congress and Exhibition, Amsterdam, The Netherlands (Jun. 3-6, 2002) 12 pages.

Buza, K., et al., "Eigenmode Identification in Campbell Diagrams", International Workshop on Machine Learning for Aerospace (2009) 4 pages.

Bathe, K-J, and Dong, J., "Component mode synthesis with subspace iterations for controlled accuracy of frequency and mode shape solutions", Computers and Structures 139:28-32 (2014) 5 pages.

\* cited by examiner

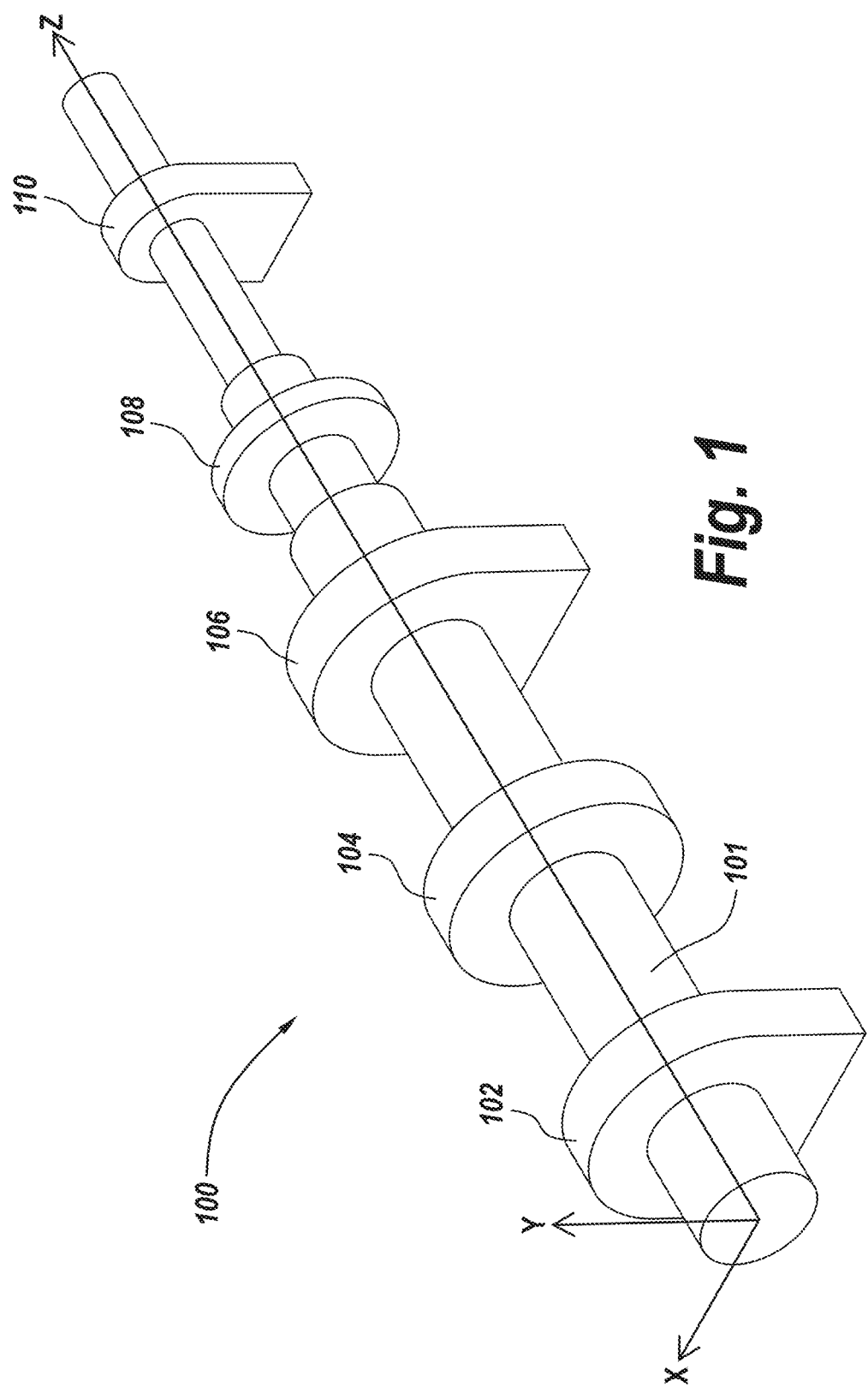

| Speed | Lookup Table for Mode | |
|---|---|---|
| S1 | Modal Properties | — 602 |
| S2 | Modal Properties | — 604 |
| S3 | Modal Properties | — 606 |
| ⋮ | ⋮ | |
| SN | Modal Properties | — 608 |

Table labeled 600.

Fig. 6

SIMULATING TRANSVERSE MOTION RESPONSE OF A FLEXIBLE ROTOR BASED ON A PARAMETER DEPENDENT EIGENMODES

SUMMARY

In accordance with an exemplary embodiment, a method is performed by a computing device. In the method, computed mode shapes of eigenmodes for a model of a rotor across values of a parameter that affect mode shapes of a rotor are received. The computed mode shapes are matched with at least selected ones of the eigenmodes and the values of the parameter. The matching includes, for at least selected ones of the eigenmodes at a given value of the parameter, generating a correlation metric of a computed mode shape for the selected eigenmodes at the given value of the parameter and one or more computed mode shapes at a previous or next value of the parameter in a sequence of values for the parameter. For at least selected ones of the computed mode shapes, the correlation metrics are used to match each selected computed mode shape with one of the selected eigenmodes and one of the values of the parameter. Modal properties relating to matched mode shapes and regarding the selected eigenmodes at the matched values of the parameter are stored. The model is executed. The execution includes simulating the transverse motion response of the rotor for a selected value of the parameter by using the stored modal properties for the selected value of the parameter, updating the parameter to a new value and simulating the transverse motion response of the shaft of the rotor for the new value of the parameter by using the stored modal properties for the new value of the parameter. Instructions that cause a processor to perform the method may be stored in a non-transitory computer-readable storage medium.

The modal properties may be stored in at least one lookup table. Using at least some of the stored mode shapes may comprise calculating an interpolated value for the mode shape from at least one of the stored modal shapes and using the interpolated value in the simulation to determine the system response to the operating conditions. The parameter is one of speed of rotation of the rotor, ambient temperature around the rotor, temperature of the rotor, temperature of a bearing positioned around the rotor, blade pitch or other controlled setting relating to the rotor shaft. The matching may comprise applying a Gale-Shapley matching algorithm or another algorithm that uses a correlation metric to maximize an objective function. The other algorithms that may be used include optimal matching algorithms, greedy matching algorithms which assign matches without replacement (i.e., once an initial match is tried, it cannot be swapped for a better match), or a combination thereof. The signs of the mode shapes may be either all positive or all negative. The method may further include computing the mode shapes of the eigenmodes for the model and normalizing the mode shapes where the received mode shapes are the normalized mode shapes. The receiving the mode shapes of the eigenmodes for the model may include receiving the mode shapes from a data source. The model may include a controller that adjusts one or more operational parameters of the model in response to the transverse motion response of the rotor. The controller may seek to avoid or accelerate/decelerate through certain rotational speeds of the shaft. The model may act as a digital twin of an actual rotor. The model may receive input regarding the actual rotor from a sensor and may pass simulation results from the model to an analysis engine. The model may be deployed in a hardware in the loop arrangement for testing a controller for the rotor.

In an exemplary embodiment, a method is performed by a computing device in which computed mode shapes of eigenmodes for a model of a rotor across values of multiple parameters that affect mode shape of the rotor are received. The computed mode shapes are matched with at least selected ones of the eigenmodes and the values of the multiple parameters. Modal properties relating to a mode shape are stored in a storage along with information regarding eigenmodes and a value of each of the parameters for each calculated mode shape. During a simulation of the response of the model of the rotor by the computing device across operating points, at least one of the stored modal properties in the storage is used to determine a transverse motion response of the rotor to operating conditions. Instructions that cause a processor to perform the method may be stored in a non-transitory computer-readable storage medium.

In accordance with an exemplary embodiment, a method is performed by a computing device, where a transverse notion response of a rotor is determined by simulating a model of the rotor. In order to determine the transverse motion response, computed mode shapes of eigenmodes for the model of a rotor for values of a parameter that affects modal shape of the rotor are received. The computed mode shapes are matched with at least selected ones of the eigenmodes and the values of the parameter. The matching includes, for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter. For at least selected ones of the computed mode shapes, the calculated correlation metrics are used to match each selected computed mode shape with one of the selected eigenmodes and one of the values of the parameter. Modal properties relating to matched mode shapes regarding the selected eigenmodes at the matched values of the parameter are stored. The model is executed. The execution includes simulating the transverse motion response of the rotor for a selected value of the parameter by using the stored modal properties for the selected value of the parameter, updating the parameter to a new value and simulating the transverse motion response of the rotor for the new value of the parameter by using the stored modal properties for the new value of the parameter. Based on the determined transverse motion response of the rotor, at least one eigenfrequency is identified, and a control system for the rotor is configured to avoid, damp or quickly pass through the identified at least one eigenfrequency. Instructions that cause a processor to perform the method may be stored in a non-transitory computer-readable storage medium.

BRIEF DESCRIPTION OF THE DRAWINGS

FIG. 1 depicts an illustrative rotor.

FIG. 6 depicts an illustrative lookup table suitable for use in an exemplary embodiment.

DETAILED DESCRIPTION

Figure 2A:
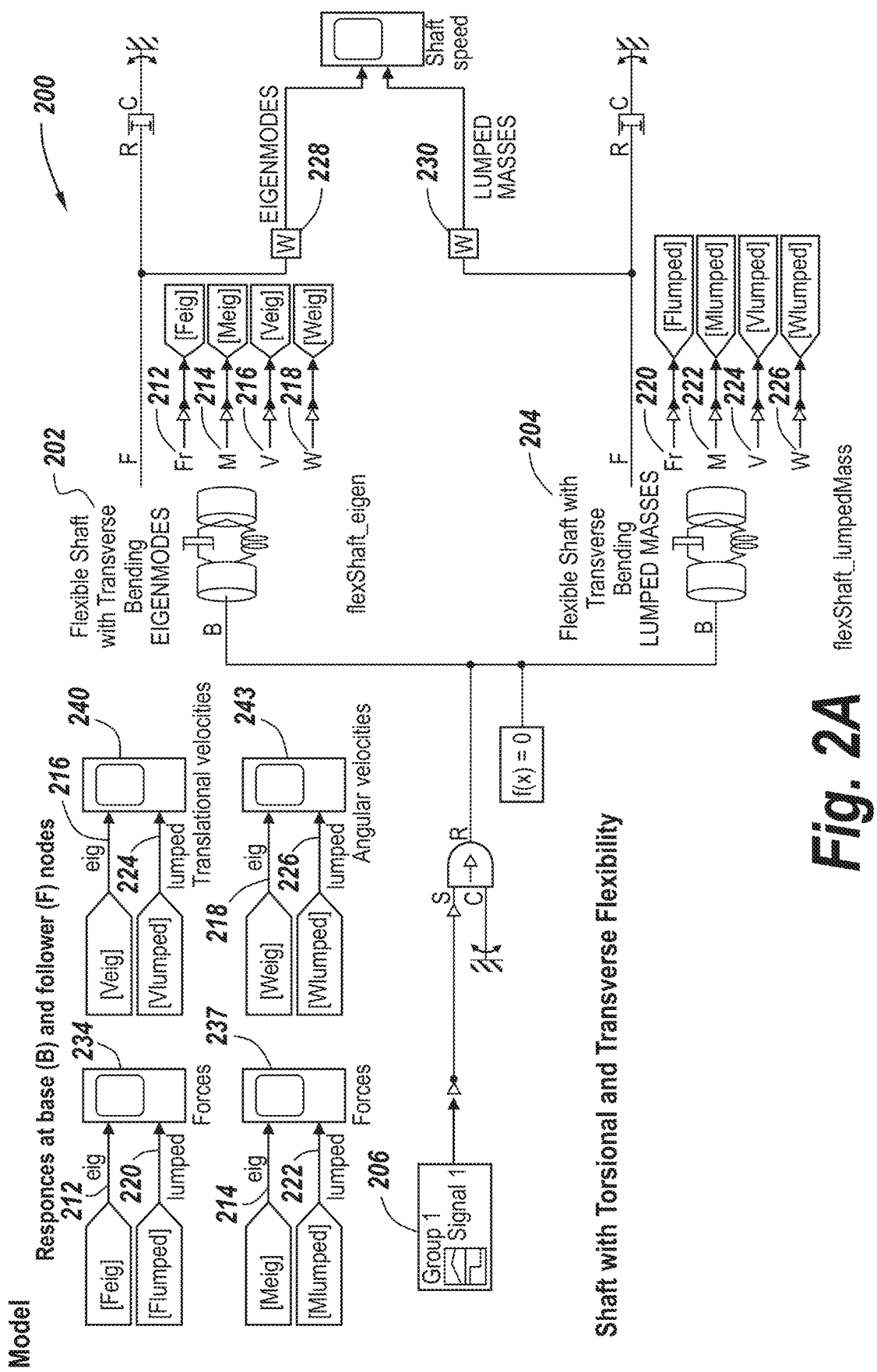
FIG. 2A depicts an example of a graphical model of a system having a rotor.

Exemplary embodiments described herein simulate the eigenmodes of a rotor in a model of a rotor and thus reduce the number of variables and computation expense required during simulation of the transverse motion response of the rotor. The exemplary embodiments may use data structures, such as lookup tables, to store precomputed information that may be used for the determining eigenmode properties ("modal properties") as the values of one or more parameters affecting the modal properties (e.g., speed, shaft temperature, bearing viscosity, normal force acting along the rotor shaft axis, turbine power level, turbine fluid flow rate, etc.) change during a simulation. The use of the data structures helps to reduce the computational expense during the simulation. The computational expense is reduced because the modal properties need not be calculated during each simulation run and because there are far fewer variables to represent the transverse motion along the flexible rotor and indicate vibration and loads during simulation. The exemplary embodiments may increase the simulation speed by a factor of 5 to 10 compared to a conventional non-reduced lumped-mass approach and may result in a greater increase in simulation speed compared to more detailed finite element formulations.

The simulating of the eigenmodes of a rotor helps in the design of a system in which the flexible rotor shaft is used and helps to predict the performance of the flexible rotor shaft. Issues with audible noise, unwanted vibration, vibration induced stress, and/or friction and fatigue can be identified and addressed.

The simulation models the transverse vibrations of a flexible rotor as the flexible rotor shaft rotates. The simulation allows a user to understand how the rotor shaft behaves during rotation, how the flexible rotor responds to unbalance, how external loads affect the flexible rotor, what the shape of the flexible rotor looks like in response to resonance frequencies, and other behavior that is of interest to the user.

Rotors are used in almost any machine with a motor driveshaft or with a pump driveshaft that spins. Examples of machines that use rotors include automobiles, planes, ships, trains, wind turbines, gas turbines, and even appliances, such as washers, dryers, hair dryers, and blenders. As such, better understanding of the behavior of rotors via simulation, such as described herein, is especially useful. A product designer or engineer can use the simulation environment to optimize the design parameters for cost and performance. Moreover, there is less of a need to devise real world experiments and/or build prototypes to test use cases, since those use cases can be vetted via the simulation environment. As a result, the simulation may avoid the cost and expense for such prototypes and experiments.

Computing the modal properties across the values of one or more parameters that affect the modal properties helps to enhance the accuracy of the modal properties used in the simulation. Thus, the accuracy of the results of the simulation can be on par with a conventional FEA approach. The exemplary embodiments have essentially the same accuracy as the conventional FEA approach while being over 5-10 times faster to execute.

Conventional approaches to simulating the transverse motion response of a rotor do not employ this approach to obtain both high computational efficiency and accuracy as the parameter values (and mode properties) gradually change within a single simulation.

In order to understand how a rotor is simulated and how conventional approaches model and simulate a rotor, it is helpful to review the components of an illustrative rotor. FIG. 1 depicts an illustrative rotor 100 and certain constituent components. The rotor 100 includes a flexible shaft 101 that rotates. The rotor 100 may include supports 102, 106, and 110. The supports 102, 106, and 110 serve as bearings. The rotor 100 may also include attachments, such as rigid masses 104 and 108. The attachments may represent gears, turbines, flywheels, or other components attached to the shaft 101 of the rotor 100.

In use, an asymmetry in the rotor, vibration, and/or an environmental asymmetry during the rotation of the rotor shaft may cause the shaft to twist and/or bend, which can lead to rotor vibrations. The vibrations may also cause stress that can result in fatigue in the components of the rotor. The vibrations may cause friction that otherwise might not be present. For example, as the rotor vibrates it may frictionally contact other components, resulting in wear and wasteful dissipation of energy. The vibration additionally may cause the rotor to emit noise. The noise can be both annoying and potentially harmful to parties in proximity to the rotor by causing hearing impairment, hearing loss, or undue stress.

To design and include a rotor for proper operation, it can be useful to understand when, how, where, and why a rotor vibrates. Modal analysis may be performed to examine the vibration response of the rotor in response to mass unbalance, misalignment, gravity, other periodic force-excitations such as those due to blades, and nonlinear sub-harmonic or super-harmonic effects, transient loads that lead to transient vibrations, and self-excited vibrations due to effects such as internal friction, surrounding fluid, or rubbing. The response of the rotor to these listed excitations depends on parameters such as speed, normal force, temperature, etc. As part of the modal analysis, it may be helpful to model the rotor and determine the transverse motion (e.g., bending) response of a shaft of the rotor. In particular, it may be helpful for the model to reflect how the shape of the shaft bends. A simulation or analysis in the software environment accounts for how the rotor responds to these excitations, and how that response is affected by these parameters. The simulation may run faster and use less memory if the simulation uses eigenmodes. This allows faster parameter optimization, simulated testing, and overall design of the rotor and a system that includes the rotor. In addition to modal analysis for examining the frequency response, many simulations may be run in the time domain to optimize or validate design.

In a conventional rotor FEA modeling approach, the rotor is viewed as being made of smaller bodies interconnected at nodes, boundary lines, or surfaces. There are multiple FEA approaches, including lumped mass, distributed mass, consistent mass, and solid rotor approaches. These approaches may define the motion matrices differently. In this example case, the lumped mass modeling approach discretizes the shaft of the rotor into N discrete flexible elements. The flexible elements are modeled as lumped inertias connected in series by damping and spring elements. Each mass has four degrees of freedom: translational and rotational in both the x and y directions perpendicular to the shaft axis. The elements provide the shaft inertia and the springs and dampers provide the shaft compliance.

The conventional lumped mass approach has to calculate 2(N+1) to 6(N+1) degrees of freedom and thus is a very computationally expensive approach that typically results in a slow simulation of a model of the rotor. In a typical rotor included in an automobile, N would be on the order of 32 for a rotor modeled using the lumped mass approach, and the eigenmode method can reduce the number of degrees of freedom to about 4. In a complex rotor used in a turbine, N may be closer to $10^5$ degrees of freedom for a detailed finite element model, and the eigenmode method may reduce the number of degrees of freedom to 10-200.

Another conventional option is to simulate the rotor with a static eigenmode model. The static eigenmode model can use the lumped mass, distributed mass, consistent mass, or solid rotor FEA matrices as starting points for deriving the eigenmodes. With the static eigenmode model, the system calculates a mode shape for each eigenmode. These mode shapes are aggregated to determine the transverse motion response of the rotor across operating conditions (e.g., rotating speed, temperature, gravity or normal load, or gear or blade coupling). This approach has the benefit of being less computationally expensive than the FEA approach since this model does not have as many degrees of freedom.

Unfortunately, the conventional static eigenmode approach has drawbacks as well. Since the rotor may have parameter dependent properties that are not taken into account, the results of a simulation of the rotor may be inaccurate. Examples of parameter dependent properties may include modal mass, stiffness, damping, forcing properties that affect translation, rotation, load, and stress response to an excitation that depend on rotating speed, temperature, gravity or normal load, gear and blade coupling (which are controlled), or shaft length. The conventional eigenmode approach does not adjust the modal mass, stiffness, damping, forcing properties as parameters such as rotational speed and temperature change, which affect the simulated response.

The approaches of the exemplary embodiments can overcome these limitations of the conventional approaches as was mentioned above. Relative to the conventional FEA approach, the differences relative to the approach of the exemplary embodiment can be seen by simulating both approaches. FIG. 2A depicts a model 200 that is configured to compare the transverse motion response of rotor 202 using the eigenmodes approach of the exemplary embodiments with the transverse motion response of rotor 204 using the conventional lumped mass approach. In the example model 200, the rotors 202 and 204 ramp up from 0 rpm to 1600 rpm over a 2 second period. A control signal 206 is passed to both rotors 202 and 204 to cause the rotor shafts to rotate. Sensors 228 and 230 may measure the rotational speed of the shafts 202 and 204, respectively and output the values to display block 231 to be displayed. The force 212, moment 214, translational velocity 216 and angular velocity 218 may be measured for the rotor 202 and passed to respective display blocks 234, 237, 240 and 243 to display the values. Similarly, the force 220, moment 222, translational velocity 224 and angular velocity 226 of rotor shaft 204 may be measured and passed to respective display blocks 234, 237, 240 and 243. Thus, a comparison of the transverse motion response of the two rotors 202 and 204 may be obtained.

In exemplary embodiments, the rotor may be represented in a simulatable or executable model as one or more components, such as a block (e.g., block 202 or block 204). The rotor may be modeled to have torsional and bending compliance. The rotor shaft may be modeled as being made of a flexible material that twists in response to an applied torque and bends in response to static mass unbalance or other excitation. The twisting action delays power transmission between the shaft ends, altering the dynamic response. This model divides the shaft into different elements that interconnect through parallel spring damper systems. The elements provide the shaft inertia while the spring damper systems provide the shaft compliance.

The component representing the rotor may provide parameterization methods that allow modeling of compliance in either a homogeneous or an axially inhomogeneous shaft. An axially inhomogeneous shaft may be viewed as one for which any of the following attributes vary along the length of the shaft: torsional stiffness torsional inertia, bending rigidity, density, shear modulus, Young's modulus, outer diameter, and/or inner diameter.

Figure 2B:
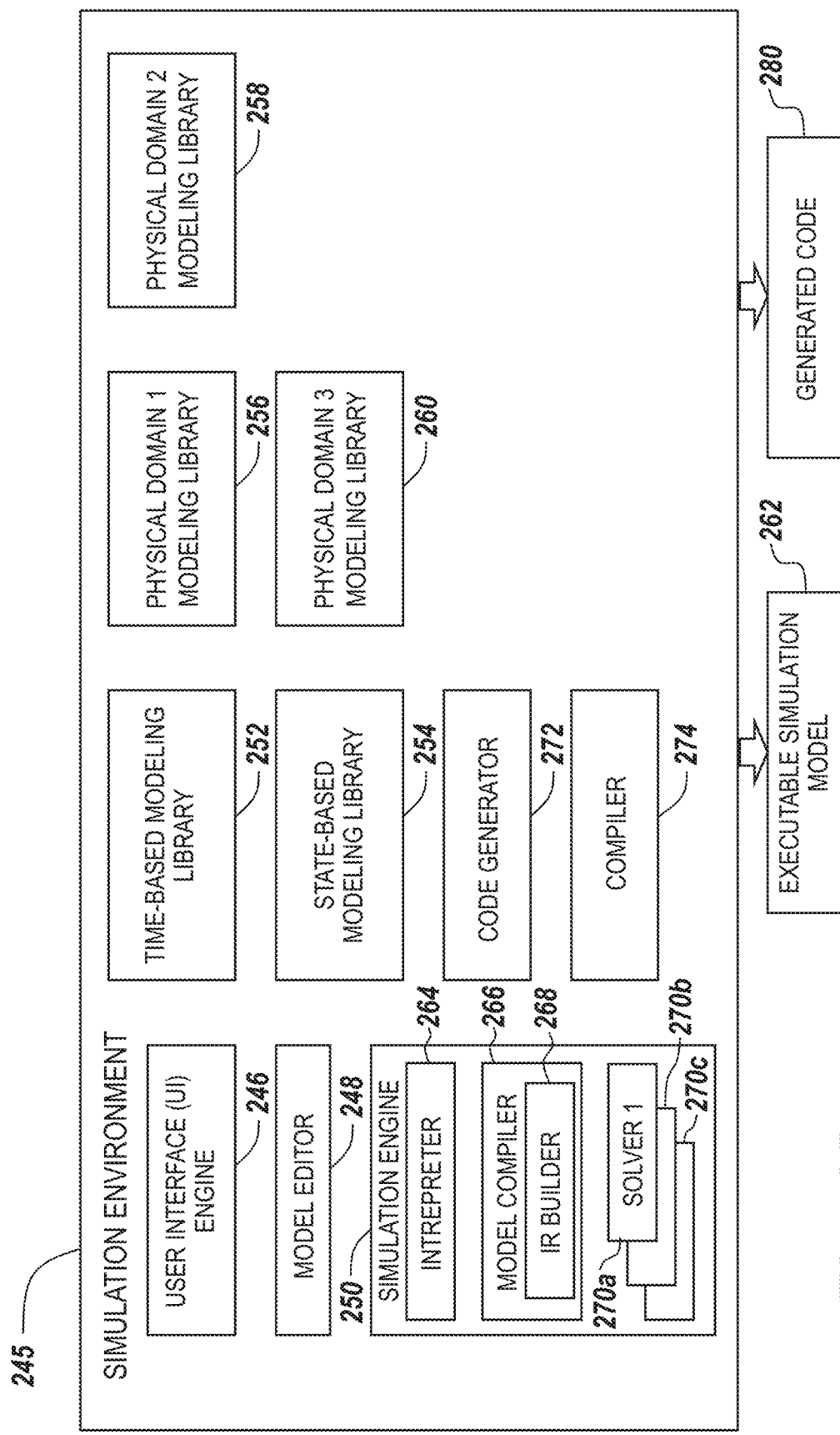
FIG. 2B depicts a simulation environment suitable for use with exemplary embodiments.

As shown in FIG. 2B, the model may be created, edited, and simulated or executed in a simulation environment 245. The simulation environment 245 may include a user interface (UI) engine 246, a model editor 248, a simulation engine 250, and one or more data stores, such as libraries, that contain predefined model element types. For example, the simulation environment may include a time-based modeling library 252, a discrete state-based modeling library 254, and one or more physical domain modeling libraries, such as physical domain modeling libraries 256, 258, and 260, for modeling different physical systems. Exemplary physical domains include electric, hydraulic, magnetic, mechanical rotation, mechanical translation, pneumatic, thermal, etc. Instances of the model element types provided by the libraries 252, 254 may be selected and included in an executable simulation model 262, e.g., by the model editor 248. The simulation engine 250 may include an interpreter 264, a model compiler 266, which may include an Intermediate Representation (IR) builder 268, and one or more solvers 270a-c. Exemplary solvers include one or more fixed-step continuous-time solvers, which may utilize integration techniques based on Euler's Method or Huen's Method, and one or more variable-step solvers, which may be based on the Runge-Kutta and Dormand-Prince pair. A description of suitable solvers may be found in the *Simulink User's Guide* from The MathWorks, Inc. (September 2019 ed.), which is hereby incorporated by reference in its entirety. In some embodiments, one or more block types may be selected from the libraries 252 and/or 254 and included in the executable simulation model 262, such that the model 262 may include an acausal portion and a causal portion.

The simulation environment 245 may include or have access to other components, such as a code generator 272 and a compiler 274. The code generator 272 may generate code, such as code 280, based on the executable simulation model 262. For example, the code 280 may have the same or equivalent functionality and/or behavior as specified by the executable simulation model 262. The generated code 280, however, may be in form suitable for execution outside of the simulation environment 245. Accordingly, the generated code 280, which may be source code, may be referred to as standalone code. The compiler 274 may compile the generated code 280 to produce an executable, e.g., object code, that may be deployed on a target platform for execution, such as an embedded system.

Exemplary code generators include the Simulink HDL Coder, the Simulink Coder, the Embedded Coder, and the Simulink PLC Coder products from The MathWorks, Inc. of Natick, Mass., and the TargetLink product from dSpace GmbH of Paderborn Germany. Exemplary code 280 that may be generated for the executable simulation model 262 includes textual source code compatible with a programming language, such as the C, C++, C#, Ada, Structured Text, Fortran, and MATLAB languages, among others. Alternately or additionally, the generated code 280 may be (or may be compiled to be) in the form of object code or machine instructions, such as an executable, suitable for execution by a target device of an embedded system, such as a central processing unit (CPU), a microprocessor, a digital signal processor, etc. In some embodiments, the generated code 280 may be in the form of a hardware description, for example, a Hardware Description Language (HDL), such as VHDL, Verilog, a netlist, or a Register Transfer Level (RTL) description. The hardware description may be utilized by one or more synthesis tools to configure a programmable hardware device, such as Programmable Logic Devices (PLDs), Field Programmable Gate Arrays (FPGAs), and Application Specific Integrated Circuits (ASICs), among others. The generated code 280 may be stored in memory, such as a main memory or persistent memory or storage, of a data processing device.

The depiction of the simulation environment 245 of FIG. 2B is meant for illustrative purposes only, and the present disclosure may be used with simulation environments having different architectures and/or additional or fewer components. For example, in some embodiments, the simulation environment 245 may include only one or more of the physical domain modeling libraries 256, 258, and 260 and not the time-based modeling library 252 or the state-based modeling library 254. Other combinations of the libraries are also possible. In some embodiments, the simulation environment 245 may include separate and/or different simulation engines for the different libraries. For example, the simulation environment 245 may include one simulation engine for executing a portion of a simulation model that includes model elements from the physical domain modeling libraries 256, 258, and 260, another simulation engine for executing a portion of a simulation model that includes model elements from the time-based modeling library 252, and yet another simulation engine for executing a portion of a simulation model that includes model elements from the state-based modeling library 254.

The simulation engine 250 may simulate the model 262 over time to obtain the transverse motion responses of the rotor shafts 202 and 204 in exemplary embodiments. The simulation engine 250 may use the data structures that hold the parameter dependent modal property values that used to determine the transverse motion response.

Examples of suitable simulation environments include the Simscape environment from The MathWorks, Inc. of Natick Mass., the Ansys Mechanical Pro environment from Ansys, Inc. of Canonsburg, Pa., the SKF Bearing Simulation tool from AB SKF of Gothenburg, Sweden, the EcoSimPro environment from EA International of Madrid, Spain, MSC Nastran from MSC software of Newport Beach, Calif., COMSOL Multiphysics Rotordynamics Module from COMSOL Group. of Stockholm, Sweden or Dyrobes Rotor Dynamics Software sold by Rodyn Vibration Analysis, Inc. of Charlottesville, Va., the Simulink® model-based design environment from The MathWorks, Inc., as well as the Simscape™ physical modeling system and the Stateflow® state chart tool also from The MathWorks, Inc., the Maple-Sim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) from Keysight Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., the Dymola modeling and simulation environment including the Modelica Libraries from Dassault Systemes of France and the Rational Rhapsody Design Manager software from IBM Corp. of Somers, N.Y. In such environments, a model of a mechanical system may be built or a previously built model may be provided. The mechanical system may include one or more rotors.

Figure 3A:
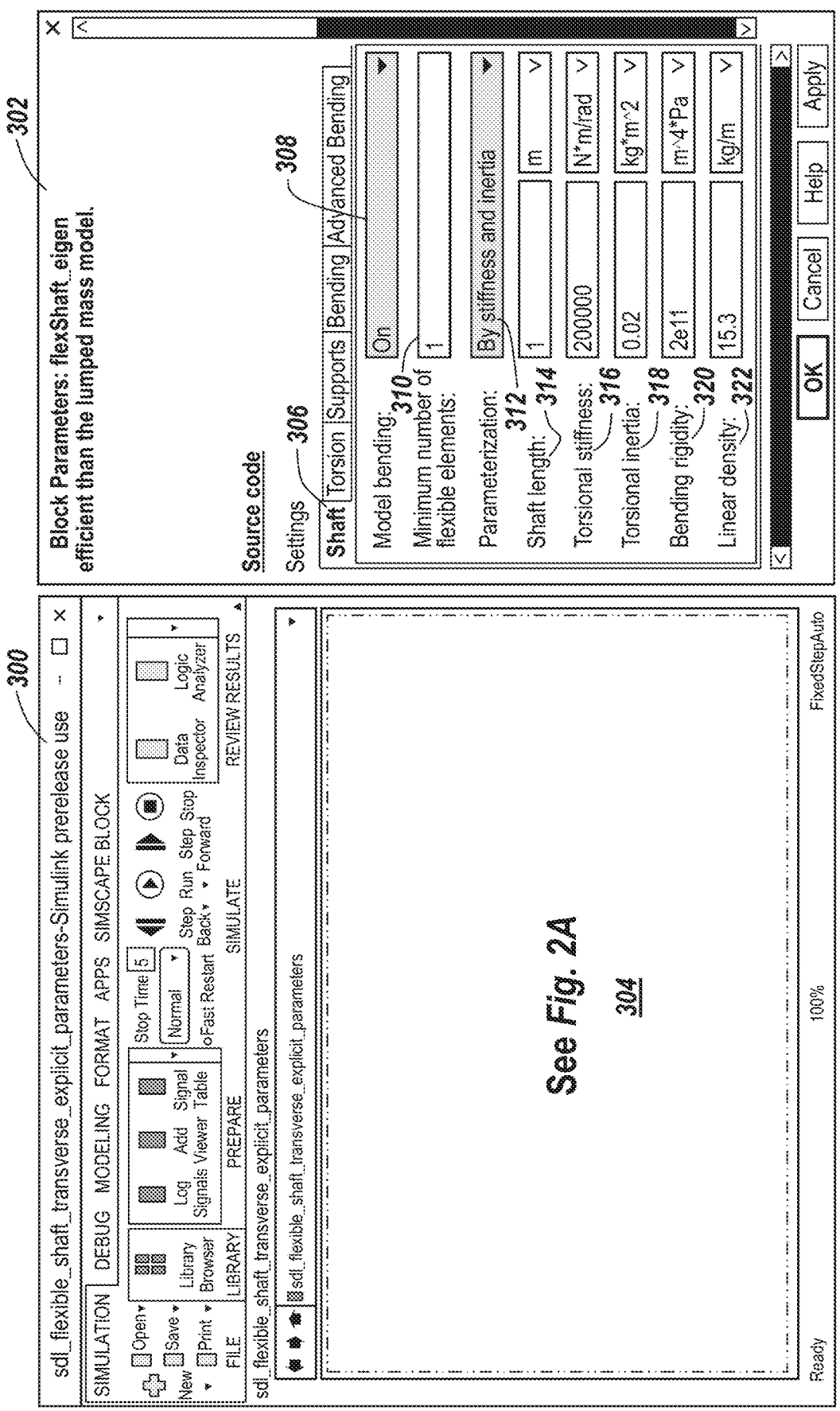
FIG. 3A depicts the model of FIG. 2A and the "shaft" tab of a user interface for configuring the rotor shaft 202.

A user may configure the model to specify parameters or features of the rotor or system that includes a rotor being simulated. As shown in FIG. 3A, in some exemplary embodiments a user interface component 302 can be displayed to allow a user to specify the characteristics relating to the model 304 (corresponding to model 200 of FIG. 2A), which is also shown in the left window 300 of FIG. 3A. In this example, a user has selected tab 306 to specify properties of the rotor (202 in FIG. 2A). The user may select or input geometry and material properties for the rotor. A field 308 is provided for selecting or inputting whether the model is to be simulated using an eigenmodes bending model like that described herein. Field 310 is provided to enable a user to specify (e.g., select or input) a minimum number of discrete elements when discretizing the rotor shaft. Field 312 enables a user to specify the type of parameterization that is applied, and fields 314 enable the specification of the length of the rotor shaft. Fields 316 enable one to specify torsional stiffness, fields 318 enable one to specify torsional inertia, and fields 320 enable one to specify bending rigidity for the rotor shaft. Fields 322 enable a user to specify a linear density for the rotor shaft.

Figure 3B:
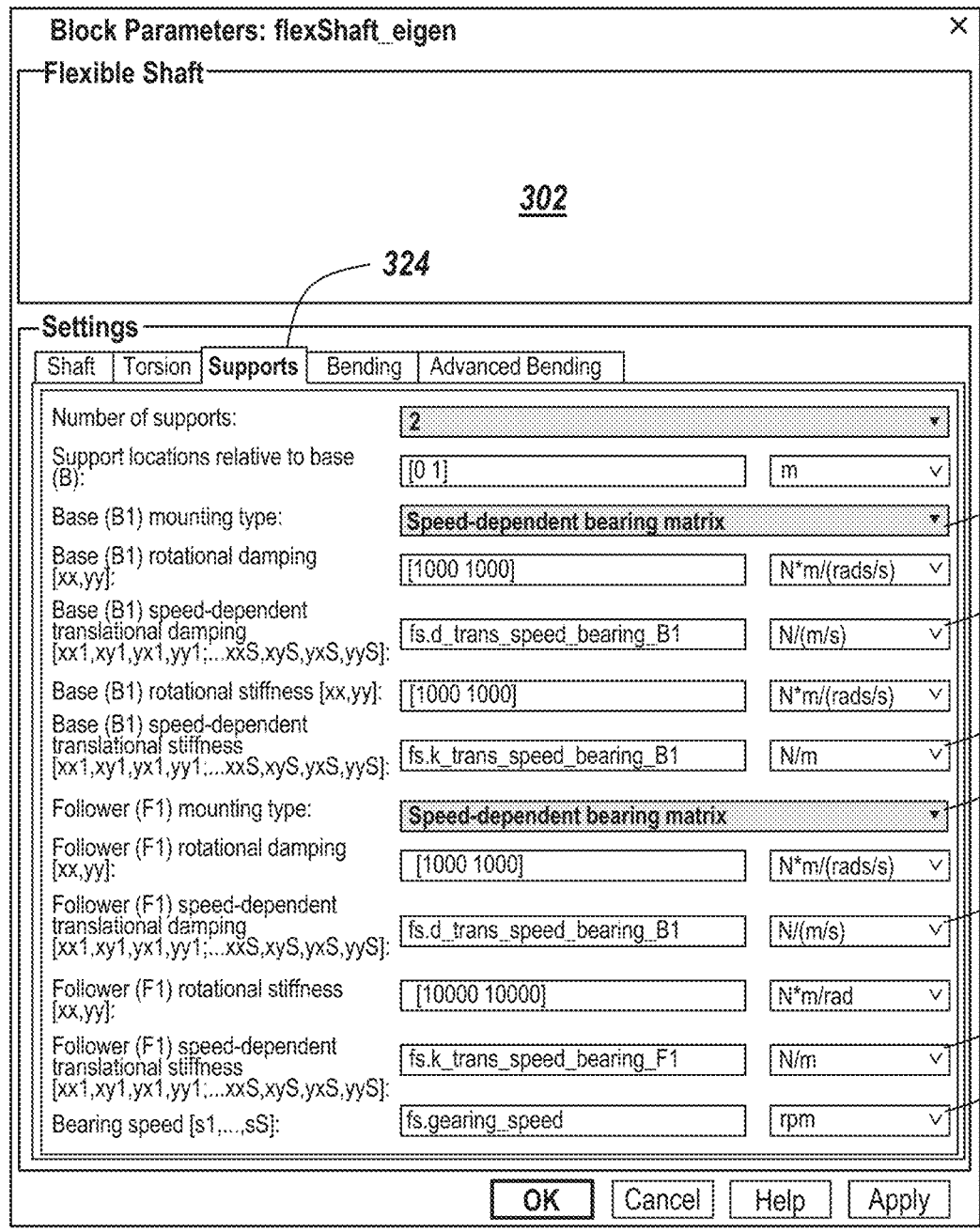
FIG. 3B depicts the "supports" tab of a user interface for configuring supports of the rotor shaft 202.

The user may also select the "supports" tab 324 (FIG. 3B) to specify information regarding the supports (such as supports 102, 106, and 110 in FIG. 1). Field 326 enables a user to specify the mounting type for the base mounting. This means the type of bearings (e.g., roller bearings, fluid bearings, etc.). The bearings are associated with the parameter-dependent properties or non-linear stiffness, damping, or mass properties. In this example, the field 326 is selected to be speed-dependent bearing matrix type. This indicates that the model is speed dependent and not constant. Field 328 enables a user to specify the base speed dependent translational damping matrix, and field 330 enables a user to specify the base speed dependent translational stiffness matrix. The tabulated stiffness and damping data of the base mounting relative to the bearing speed is specified via these fields 328 and 330. In the example of FIG. 3B, the names of the matrices are provided in fields 328 and 330.

Field 332 enables a party to select the follower mounting (e.g., 110) type. The mounting may be specified as speed dependent or static. In the example of FIG. 3B the type is selected as a speed-dependent bearing matrix. Field 334 enables a user to specify the speed dependent translational damping matrix, and field 336 enables a user to specify the speed dependent translational stiffness matrix. The tabulated stiffness and damping data of the follower mounting relative to the bearing speed is specified via these fields 334 and 336. Field 338 enables a user to specify a vector of reference rotation speeds. In particular, the field 338 specifies a vector of bearing speeds that correspond to the values of speed that affect the mode shapes and for which values are stored in the data structures used for storing the modal property information. The other fields shown in FIG. 3B are self-explanatory.

Figure 3C:
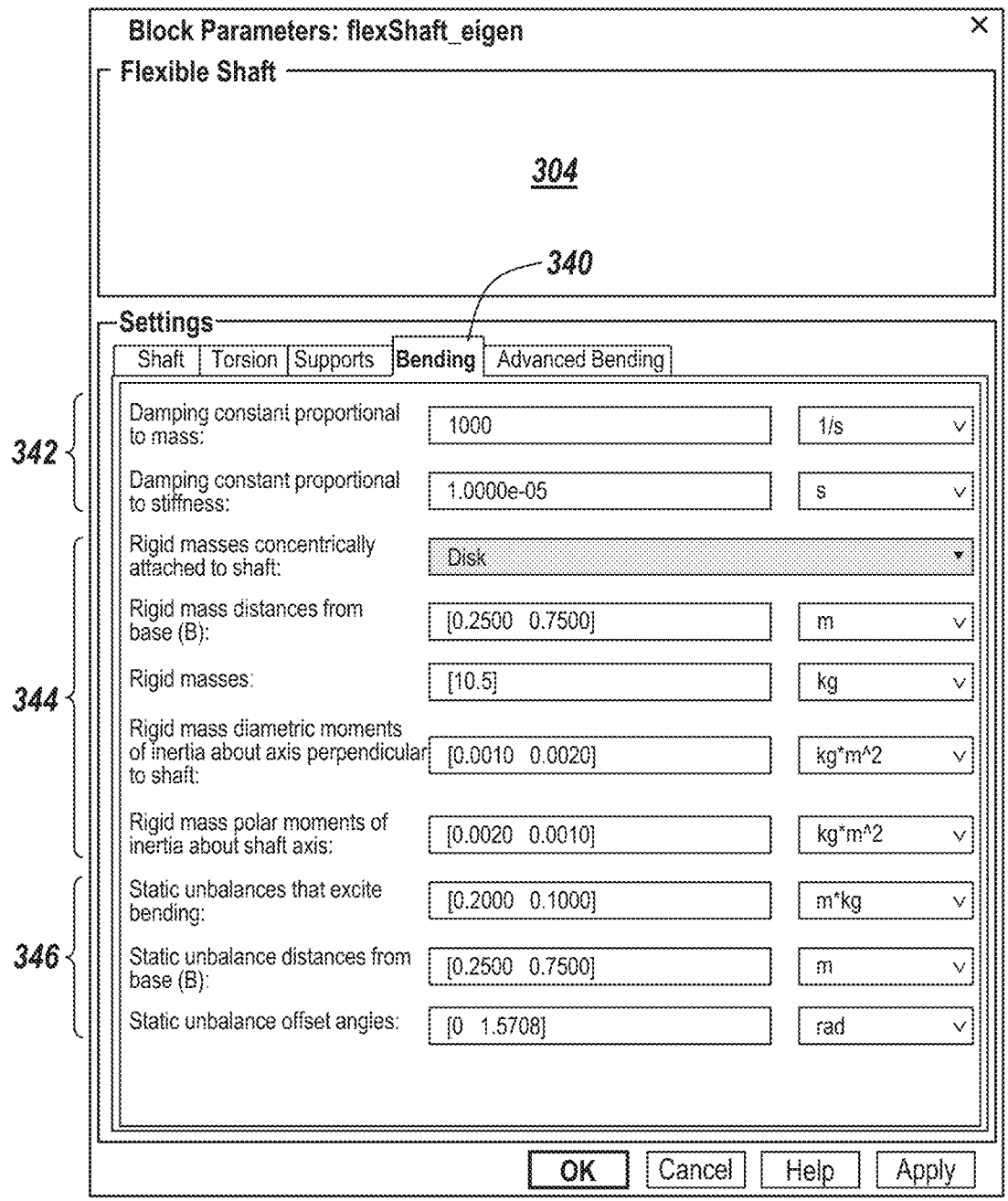
FIG. 3C depicts the "bending" tab of a user interface for configuring characteristics of the rotor that affect bending of the rotor.

The user may select the "bending" tab 340 as shown in FIG. 3C to specify properties relating to bending. Fields 342 are provided to specify damping constant bending parameters. Fields 344 enable a user to specify parameters regarding any rigid masses attached to the rotor shaft. The user can specify things such as type of rigid mass, location, diametric moment, and polar moments. Fields 346 enable a user to specify properties of static unbalances on the rotor that excite bending, such as location and offset angles. In some embodiments, parameter settings for turbine coupling and damping may be displayed for setting by the user.

Figure 3D:
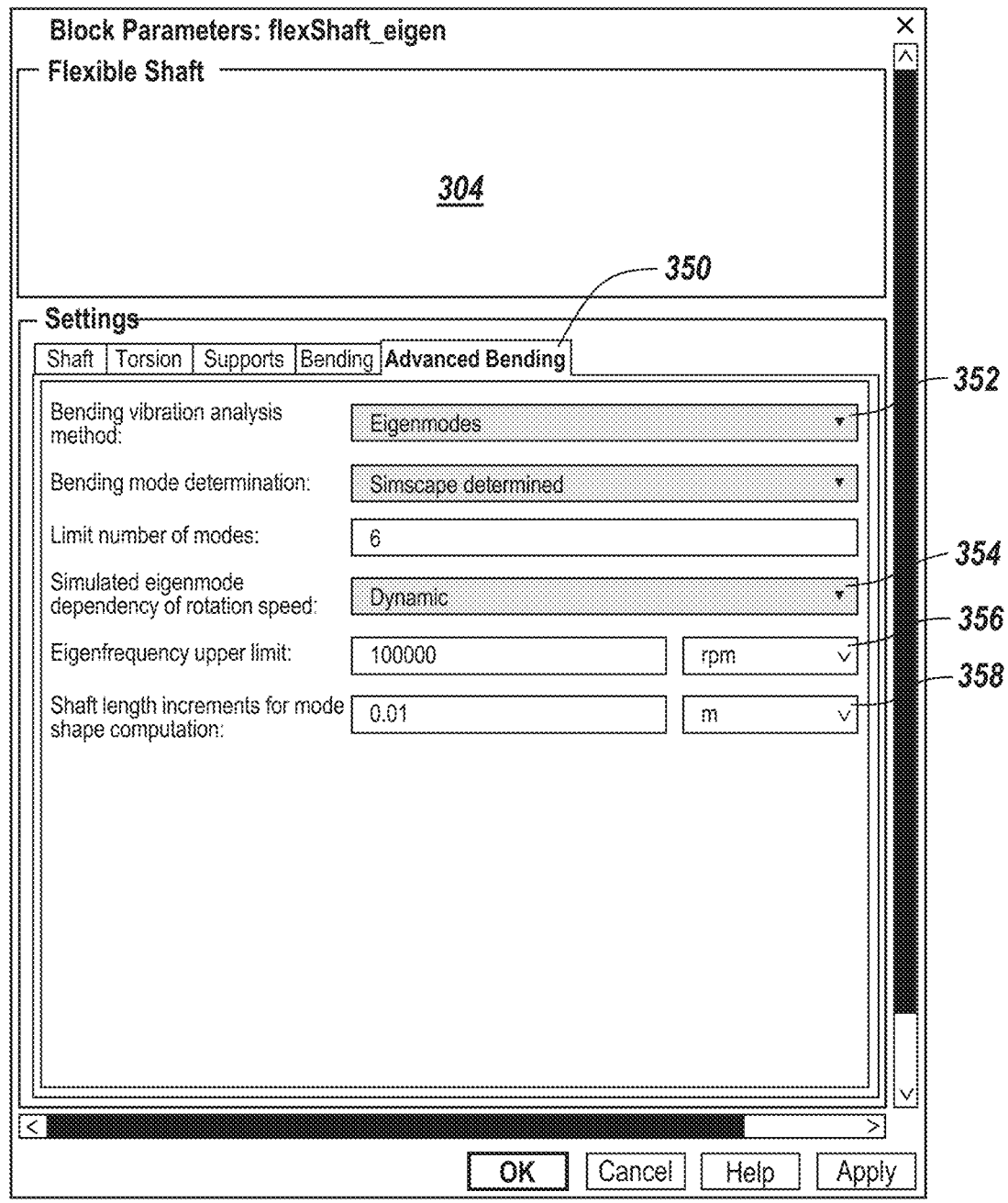
FIG. 3D depicts the "advanced bending" tab of a user interface for configuring the rotor shaft 202 advanced characteristics relating to bending of the rotor.

A user may also specify advanced bending properties by selecting the "advanced bending" tab 350 (FIG. 3D). Fields on this tab 350 enable a user to specify the type of model is to be used to simulate bending of the rotor. Field 352 presents the options of selecting the bending vibration analysis mode as FEA or eigenmodes. In the example of FIG. 2F, the eigenmodes option has been chosen. This means that the eigenmodes approach will be used for determining the transverse motion response for the rotor 202 (FIG. 2A) in the simulation of the model 200. The option of using the conventional FEA approach may be selected and is selected for the other rotor shaft component 204. Field 354 allows a user to select eigenmode dependency on rotation speed as static or dynamic. In the example of FIG. 3D, the dynamic option has been chosen to indicate that eigenmode properties depend on rotation speed for rotor shaft component 202. In contrast, if "static" is chosen, the eigenmodes are static and do not have a dependency on parameters such as speed. This "static" option corresponds to the above-described conventional eigenmodes approach. Field 356 enables a user to specify an eigenfrequency upper limit such that only eigenmodes with eigenfrequencies less than or equal to this limit parameter are simulated, and field 358 enables a user to specify shaft length increments for mode shape computation. This parameter specifies intervals along the shaft where FEA degrees of freedom are placed. An example of how the transverse motion response of the rotor 202 in model 200 of FIG. 2A is determined using the data structures will be set forth below.

It should be appreciated that the depiction of the model and user interfaces in FIG. 2A and associated property sheets of FIGS. 3A, 3B, 3C, and 3D is merely illustrative and is not intended to be limiting. The exemplary embodiments may be practiced with other types of models, including textual models, different types of graphical models or the like and may be practiced with different user interface elements. In some exemplary embodiments, the configuration of the model may be done by using a configuration file or entering configuration settings via a command line. A user may provide equation of motion matrices that define the dynamics system, or the software derives these matrices, before the invention is implemented (see step 302 in FIG. 3) Not all models require the same configuration settings as detailed above. Some need fewer and some need more.

Figure 4A:
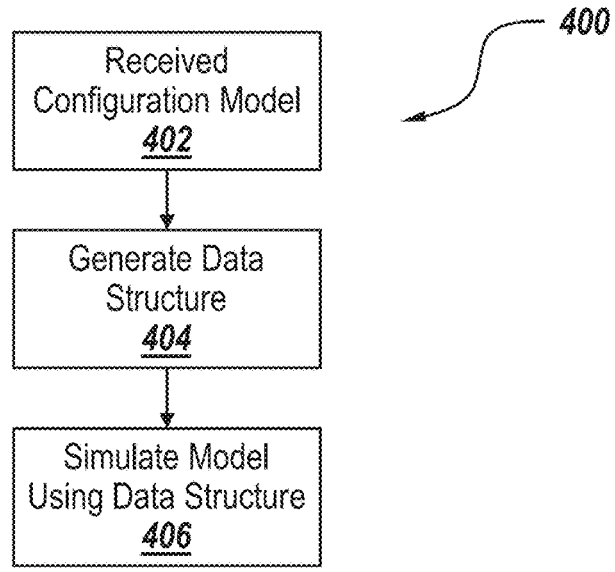
FIG. 4A depicts a flowchart illustrating steps that may be performed in an exemplary embodiment.

FIG. 4A depicts a flowchart 400 that provides an overview of an example process that may be practiced by an exemplary embodiment in simulating the transverse motion response of a rotor in a mechanical system. The process can be implemented via the executable simulation model and simulation engine 250 of the simulation environment 245 shown in FIG. 2B. Initially, a configured model of a system with a rotor is received in a simulation environment (402). The model 200 shown in FIG. 2A is an example of such a model. The model 200 may contain blocks that are interconnected. Each block represents a component of the system. In the example of FIG. 2A, each block represents a physical component, an input, or an output. The model 200 may be configured before simulation begins, such as described above.

Two typical mathematical representations of the rotor (202), also referred to as the equations of motion, are described below.

One representation has the form, $$M\ddot{\vec{x}}+(B(\Omega)+\Omega G(\Omega))\dot{\vec{x}}+(K(\Omega)+\dot{\Omega}G(\Omega))\vec{x}=\vec{f}(\Omega,\phi), \qquad (1)$$

Where the dot superscript indicates derivative with respect to time. $\vec{x}$ is the finite element system nodal vector that contains translation and rotation degrees of freedom at selected node locations. M, B, G, and K are the finite element system mass, damping, gyroscopic, and stiffness matrices, respectively. In this representation, the damping B, gyroscopic matrix G, and stiffness K are functions of shaft rotation speed, $\Omega$. $\vec{f}$ is the finite element system forcing vector due to external excitations. In this representation, $\vec{f}$ is a function of the rotation speed, $\Omega$, and shaft rotation angle, $\phi$.

Another mathematical representation is the state-space form of Equation (1), $$\dot{\vec{y}} = A\vec{y} + C\vec{f}(\Omega,\phi), \quad (2a)$$

Where $$\vec{y} = \begin{bmatrix} \vec{x} \\ \dot{\vec{x}} \end{bmatrix}, \quad (2b)$$

$$A = \begin{bmatrix} [0] & I \\ -M^{-1}(K(\Omega) + \Omega G(\Omega)) & -M^{-1}(B(\Omega) + \Omega G(\Omega)) \end{bmatrix} \quad (2c)$$

$$C = \begin{bmatrix} [0] \\ M^{-1} \end{bmatrix} \quad (2d)$$

Data structures, such as lookup tables, are generated (404) to hold eigenmode property information relating to modal shapes across parameter values. This generation occurs prior to simulation. The eigenmode property information contains values of modal mass, damping, stiffness, gyroscopics, and forcing of the rotor 202 stored, e.g., in matrices or other suitable formats. How this information is generated is described in more detail below. The simulation of the rotation of the rotor shaft and the resulting transverse motion response of the rotor are performed using the model and the data structures (406).

Figure 4B:
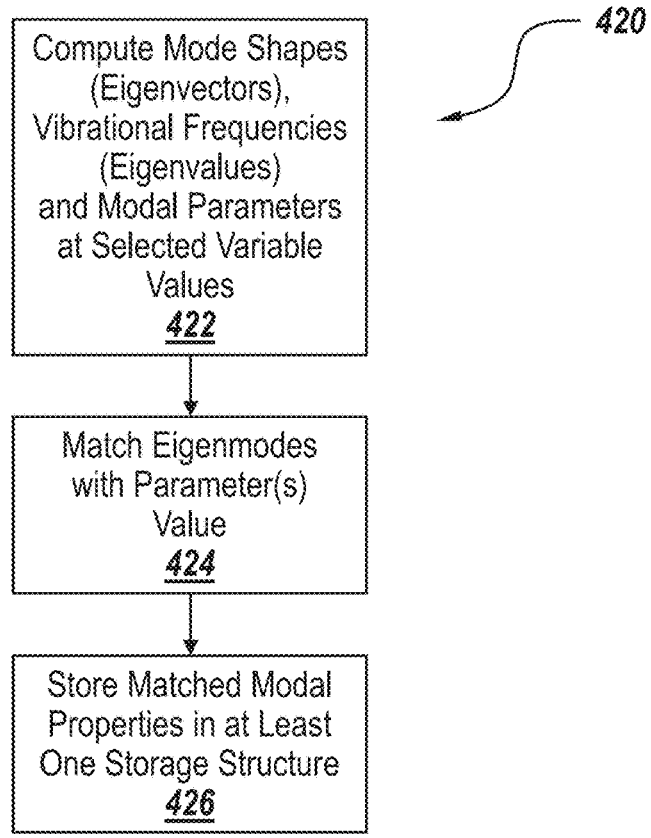
FIG. 4B depicts a flowchart illustrating steps that may be performed to compute modal properties and to store the modal properties in data structures in an exemplary embodiment.

FIG. 4B depicts a flowchart 420 that shows steps that may be performed in an exemplary embodiment in generating the data structures (see 404 in FIG. 4A), e.g., by the simulation engine 250 of the simulation environment 245 of FIG. 2B. This process is performed before the simulation begins, e.g., during compilation of the model and helps to enhance the accuracy as compared to the conventional static eigenmodes method described above, while improving the efficiency of the simulation relative to the conventional FEA approach. The eigenmode properties that depend on other variables or parameters are updated using lookup tables during simulation to achieve accuracy, on par with the conventional FEA method described above. The simulation remains computationally efficient, similarly to the conventional static eigenmodes approach described above, because the computationally expensive calculations of the eigenmode properties is done during compile time. Initially, the exemplary embodiments may compute mode shapes and associated vibrational frequency for eigenmodes of interest at user-specified values over ranges of the one or more parameters that affect the eigenmode properties (422). The mode shape (i.e. eigenmode) refers to how a structure deforms at a particular natural frequency (i.e., eigenfrequency). Major parameters that may be stored in this structure can include: modal mass, modal damping, modal gyroscopic matrix, modal stiffness, and modal forcing. Major variables that affect these parameters are: shaft rotation speed, temperature, normal force, blade pitch, and gear coupling. The user may select discrete values of these variables that are used as breakpoints in the lookup table.

The exemplary embodiment may make normalized planar mode (as opposed to complex mode) calculations for the eigenmode properties, for instance, using the "eigs" function provided by MATLAB from The MathWorks, Inc. Other mechanisms for calculating the normalized mode calculations may be used. The eigs function may be called to yield the tuple set forth below as follows:

$$[H,\lambda] = \text{eigs}(\text{sparse}(K),\text{sparse}(M),m_{Max},\text{'smallestabs'}) \quad (3)$$

where,

H is the eigenvector matrix in which each column is an eigenvector (or "eigenmode") in the $\vec{x}$ coordinates.

$\lambda$ are the eigenvalues, which are the square of the eigenfrequencies ($\lambda^{0.5}$ are the eigenfrequencies).

$m_{Max}$ is the limit number of modes.

The eigs function uses M (the mass matrix) and K (the stiffness matrix) but neglects B (the damping matrix).

The exemplary embodiments may alternatively calculate normalized complex mode shapes rather than normalized planar mode shapes. Complex mode shapes result from significant damping. In that case, $$[H\_\text{left},\lambda] = \text{eigs}(\text{sparse}(A),m_{Max},\text{'smallestabs'}), \quad (4a)$$

$$[H\_\text{right},\lambda] = \text{eigs}(\text{sparse}(\text{transpose}(A)),m_{Max},\text{'smallestabs'}), \quad (4b)$$

where the outputs H_left, H_fight, and $\lambda$ are complex.

H_left is a matrix where each column contains the left eigenvectors.

H_fight is a matrix where each column contains the right eigenvectors.

$\lambda$ are the eigenvalues, and both of the above eigs commands output the same $\lambda$. The imaginary components of $\lambda$ are the eigenfrequencies. Unlike for planar modes, $H_{left} \neq H_{right}^T$ (T superscript is for transpose).

A is the state-space matrix defined above.

Figure 5A:
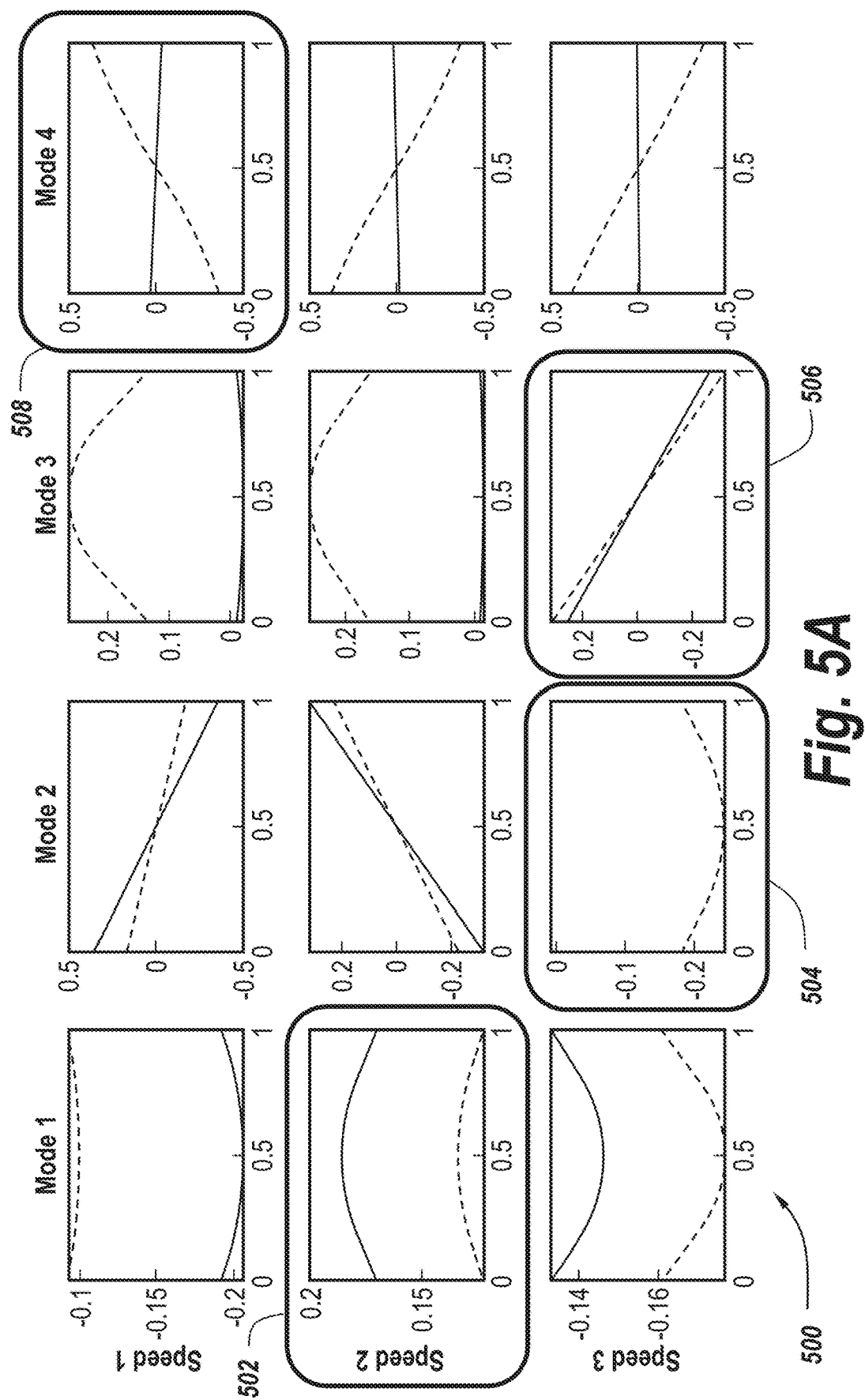
FIG. 5A depicts illustrative modal shape plots based on mode and speed before normalizing the mode shapes.

FIG. 5A shows an example of plots 500 of mode shapes resulting from computed normalized planar mode shapes across the four lowest modes (labelled as Modes 1-4) for three speeds of rotation of the rotor shaft for an example case. Computation of the mode shapes at each of the 3 speeds can be done independently. The speeds can be arranged in either a monotonically increasing sequence or a monotonically decreasing sequence. These mode shapes are not normalized. It is useful to normalize the mode shapes so that the amplitudes are in a range between +1 to −1 for instance. The normalization is helpful for having all the modal shapes on a common scale and is needed for the matching algorithm detailed below. The highlighted plots 502, 504, 506, and 508 all extend across different ranges.

For complex mode shapes, normalization also may be useful. To normalize with complex modes, the shaft axis location with the largest mode shape magnitude is located. Then the complex angle of the shape at that location is located. The entire shape is rotated (a.k.a. multiplied) by a complex angle so that the largest magnitude has a value of 1.

Once the eigenvectors and eigenvalues have been computed, modal property matrices are computed. These matrices or information relating to these matrices are what may be stored in the data structures as the eigenmode properties.

The modal matrices, $M_{Modal}$, $B_{Modal}$, $K_{Modal}$, and $f_{Modal}$, are $$M_{Modal} = H^T M H \quad (5a)$$

$$K_{Modal} = H^T K H \quad (5b)$$

$$B_{Modal} = H^T B H \quad (5c)$$

$$G_{Modal} = H^T G H \quad (5d)$$

$$\vec{f}_{Modal} = H^T \vec{f} \quad (5e)$$

$M_{Modal}$, $B_{Modal}$, $G_{Modal}$, and $K_{Modal}$ are the modal mass, damping, gyroscopic, and stiffness matrices, respectively. $\vec{f}_{Modal}$ is the modal forcing vector. M, B, G, and K are the finite element system mass, damping, gyroscopic, and stiffness matrices, respectively, as described above. $\vec{f}$ is the finite element system forcing vector as described above. According to standard modal analysis, the modal matrices are substituted into the equation of motion (1) to result in the eigenmode equation of motion:

$$M_{Modal}\ddot{\vec{\eta}} + (B_{Modal}+\Omega G_{Modal})\dot{\vec{\eta}} + (K_{Modal}+\Omega G_{Modal})\vec{\eta} = \vec{f}_{Modal} \quad (6a)$$

Where the modal degrees of freedom, $\vec{\eta}$, relate to the node degrees of freedom, $\vec{x}$, by:

$$\vec{x} = H\vec{\eta} \quad (6b)$$

$\vec{\eta}$ has fewer degrees of freedom than x, so the eigenmode equation of motion will simulate with higher computational efficiency that the finite element equation of motion. The traditional constant eigenmode method only uses one set of $M_{Modal}$, $B_{Modal}$, $G_{Modal}$, $K_{Modal}$, and $\vec{f}_{Modal}$ modal parameters, which are computed for fixed values of variables that affect the modal parameters, such as rotation speed. This causes the traditional constant eigenmode method to be inaccurate if the variable values differ from the chosen fixed values used for the eigenmode computation. The modal matrices $K_{Modal}$ and $f_{Modal}$ associated with 4 modes at 3 rotor speeds are shown below for an illustrative case. $K_{Modal}$ and $f_{Modal}$ are implemented as 3D matrices where each page (the $3^{rd}$ dimension) is for a different speed. Each matrix page is the result of an independent modal computation that does not consider how the values on different pages relate to each other.

| Kmodal_lowest_4_modes(:, :, 1) = 1.0e+06 + | | | |
|---|---|---|---|
| 0.0673 | 0.0000 | −0.0000 | 0.0000 |
| 0.0000 | 0.2318 | 0.0000 | −0.0000 |
| 0.0000 | 0.0000 | 0.5058 | −0.0000 |
| 0.0000 | −0.0000 | 0.0000 | 2.3911 |

| Kmodal_lowest_4_modes(:, :, 2) = 1.0e+06 + | | | |
|---|---|---|---|
| 0.0801 | 0.0000 | 0.0000 | 0.0000 |
| 0.0000 | 0.2757 | −0.0000 | −0.0000 |
| −0.0000 | −0.0000 | 0.3701 | −0.0000 |
| 0.0000 | 0.0000 | 0.0000 | 1.5336 |

| Kmodal_lowest_4_modes(:, :, 3) = 1.0e+05 + | | | |
|---|---|---|---|
| 0.8747 | −0.0000 | −0.0000 | −0.0000 |
| −0.0000 | 2.4877 | −0.0000 | −0.0000 |
| −0.0000 | −0.0000 | 3.0132 | −0.0000 |
| −0.0000 | −0.0000 | −0.0000 | 9.3532 |

| Fmodal_lowest_4_modes(:, :, 1) = | | | |
|---|---|---|---|
| 0.0025 | 0.0002 | −0.0002 | 0.0025 |
| 0.0000 | 0.0000 | −0.0000 | 0.0000 |
| −0.0016 | 0.0033 | −0.0033 | −0.0016 |
| −0.0000 | 0.0000 | −0.0000 | −0.0000 |

| Fmodal_lowest_4_nodes(:, :, 2) = | | | |
|---|---|---|---|
| 0.0025 | 0.0001 | −0.0001 | 0.0025 |
| 0.0000 | −0.0000 | 0.0000 | 0.0000 |
| −0.0022 | 0.0031 | −0.0031 | −0.0022 |
| 0.0000 | −0.0000 | 0.0000 | 0.0000 |

| Fmodal_lowest_4_nodes(:, :, 3) = | | | |
|---|---|---|---|
| 0.0031 | 0.0001 | −0.0001 | 0.0031 |
| −0.0035 | 0.0029 | −0.0029 | −0.0035 |
| 0.0000 | 0.0000 | −0.0000 | 0.0000 |
| −0.0000 | 0.0000 | −0.0000 | −0.0000 |

For complex eigenmodes, the modal matrices may be derived from the state-space form of the equation of motion, so $A_{Modal}$ and $C_{Modal}$ are used instead of $M_{Modal}$, $B_{Modal}$, $K_{Modal}$, and $f_{Modal}$:

$$A_{Modal} = H_{Left}^T A H_{Right} = \lambda \quad (7a)$$

$$C_{Modal} = H_{Left}^T C, \quad (7b)$$

Where $A_{Modal} = \lambda$ is a diagonal matrix containing the eigenvalues.

According to standard modal analysis, the modal matrices are substituted into the state-space equation of motion (2) to result in the eigenmode equation of motion:

$$H_{Left}^T H_{Right} \dot{\vec{\eta}} = A_{Modal} \vec{\eta} + C_{Modal} \vec{f}_{Modal}, \quad (7c)$$

Or the equivalent equation, $$\dot{\vec{\eta}} = \lambda \vec{\eta} + C_{Modal} \vec{f}_{Modal}, \quad (7d)$$

The modal degrees of freedom, $\vec{\eta}$, relate to the node degrees of freedom, $\vec{y}$, by:

$$\vec{y} = H_{Right} \vec{\eta} \quad (7e)$$

$\vec{\eta}$ has fewer degrees of freedom than $\vec{y}$, so the eigenmode equation of motion will simulate with higher computational efficiency than the finite element equation of motion. The traditional constant eigenmode method only uses one set of $A_{Modal}$ and $C_{Modal}$ modal parameters, which are computed for fixed values of variables that affect the modal parameters, such as rotation speed. This causes the traditional constant eigenmode method to be inaccurate if the variable values differ from the chosen fixed values sued for the eigenmode computation.

The increasing order of eigenfrequency magnitudes may change as the speed of the rotor changes. For example, the order of eigenfrequencies may change as the speed of a rotor changes. The eigenfrequencies can be arranged in a specific order if the data structure is a matrix used for interpolation. Another kind of data structure may be used that keeps track of which eigenfrequencies/modal parameters are associated with each other. In some implementations, this kind of data structure does not contain other information than the tracking information.

Figure 5B:
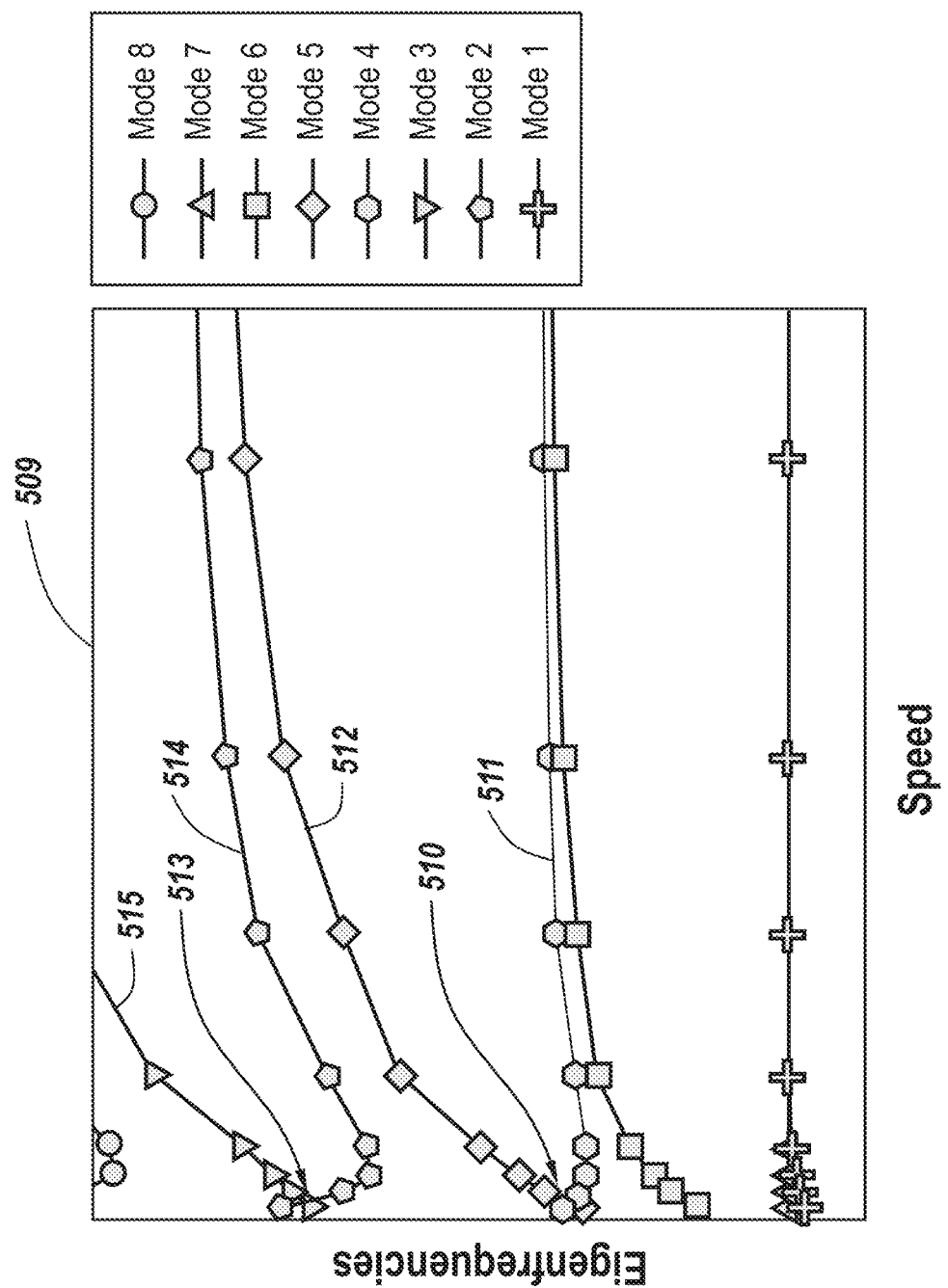
FIG. 5B depicts an example of the swapping of positions of eigenfrequencies for a sequence of eigenmodes as rotational speed of a rotor shaft changes.

In some implementations, a number of eigenfrequencies swap position in a sequence as speed increases, as illustrated in FIG. 5B below. This swapping of position may be especially pronounced at start up of the rotor motion going up from speed 0, but some rotors may have crossing and veering eigenfrequency values throughout the parameter range.

FIG. 5B shows an example that demonstrates such swapping of positions by eigenfrequencies. The plot 509 plots eigenfrequencies over speed for different eigenmodes. The eigenmodes (1-8) are labelled by their number in a sequence. Initially, at speed 0, the corresponding eigenfrequencies are arranged in the initial sequence. This initial sequence changes, however, as speed increases. For instance, as can be seen at arrow 510, the curve 511 for the eigenfrequency of eigenmode 5 crosses the curve 512 for the eigenfrequency of eigenmode 4 as speed increases. Similarly, as shown, arrow 513 points to where the curve 514 for the eigenfrequency of eigenmode 7 crosses the curve 515 for the eigenfrequency of eigenmode 6.

Because of this swapping of order, the exemplary embodiments match each distinct eigenmode to an associated mode shape as parameter values, such as rotation speed, temperature, gravity or normal load, gear and blade coupling, or shaft length, change using the method described below (424 in FIG. 4B). For the case of the parameter being rotation speed, eigenmodes can be matched based on rotation speed. The parameter may be one or more of speed of rotation of the rotor, ambient temperature around the rotor, temperature of the rotor, or temperature of a bearing positioned around the rotor, for example. In particular, the exemplary embodiments may look at similarity between mode shapes across adjacent parameter values for successive eigenmodes. The similarity metric is used to assign each mode shape to a fit an eigenmode/parameter value pair. This process may also be applied in embodiments where multiple parameter values affect mode shapes. In that case, the pairing occurs across multiple parameter value tuples.

Figure 5C:
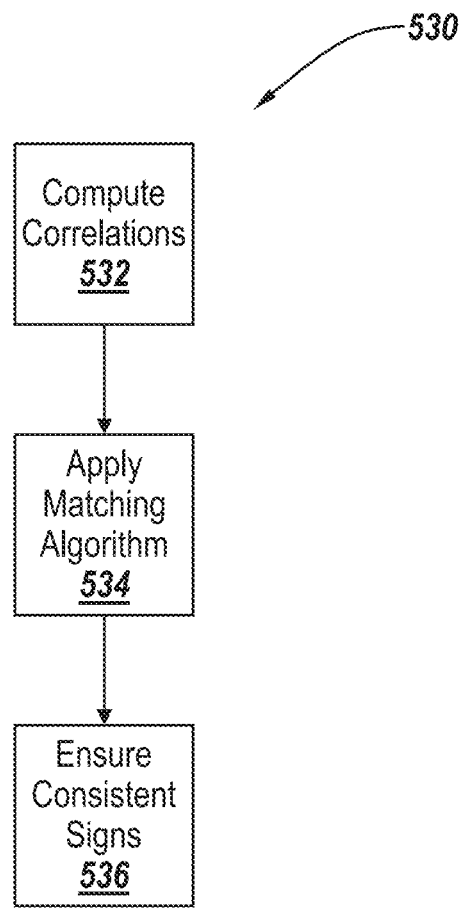
FIG. 5C depicts a flowchart illustrating steps that may be performed to match mode shapes and ensure correct signs on coefficients.

FIG. 5C depicts a flowchart 530 that shows example steps that may be performed to match modes based on different parameter values. Correlations among the eigenmode shapes (that is, the natural vibration shape of the rotor) may be calculated by calculating a correlation metric (532). The basic notion is to identify mode shapes that are similar and match each mode shape with the eigenmode having the most similar (i.e., most correlated) shapes. One suitable metric is to calculate an integral as follows:

For each mode at speed i, compute a correlation to all mode shapes at the previous speed, i−1:

$$\mathbb{C} = \int |U_i * U_{i-1}| dz \tag{8}$$

where $U_i$ is the mode shape at speed i and $U_{i-1}$ is the mode shape at speed (i−1). This metric is a type of modal assurance criterion. This calculation multiplies the mode shape magnitudes together and integrates the resultant product values for all the points z along the axis of the rotor shaft. According to the well-known orthogonality property of mode shapes, this metric will be large if two mode shapes are similar and small if the mode shapes are not similar.

Other correlation metrics may be utilized to determine how similar the mode shapes are. The use of the $\mathbb{C}$ metric is just one example of such a metric. Other correlation metrics might involve the mass or stiffness matrix, which, because of the mode orthogonality property, may more clearly indicate pairs. Moreover, the correlation metric may be used for multiple parameters and for parameters other than speed.

Once the correlation metrics have been calculated (532), a matching algorithm may be applied to match the modes and parameter values (534). Some parameters and correlation metrics may have a clear 1:1 mapping that does not require sorting, but there is no guarantee that this will be the case, especially for large parameter changes or modes with high gradients with respect to the changing parameter. A suitable matching algorithm is the Gale-Shapley algorithm, see Gale, D.; Shapley, L. S. (1962). "*College Admissions and the Stability Marriage*". American Mathematical Monthly. 69 (1): 9-14. This pairwise matching algorithm that will swap modes if a different mode is a better fit for the specified speed so that the order of modes is adjusted properly. That said, other pairwise matching algorithms may be applied. In this application, the matching algorithm assigns the mode shape to an eigenmode based on the correlation metric values. More particularly, ("M" are the modes at speed i and "W" are the modes at speed i+1) for this application of the algorithm.

The exemplary embodiments may then take steps to ensure consistent signs are used for the mode shapes (536). For example, in FIG. 5A, the initially computed mode shapes 504, 506, and 508 have different signs (positive and negative). Consistent modal signs may be of value because it affects the sign of the external forcing due to rotor mass asymmetry (i.e., unbalance) that causes transverse vibration of the rotor. The coefficients in the equations of motion as set forth above are computed from the eigenvectors (i.e., the modal shapes). As such, if the eigenvectors have an inconsistent sign, then the interpolated modal forcing has an incorrect value and the simulation can be inaccurate at intermediate speeds (e.g., between the user-defined reference speeds at which the modes are computed if lookup tables are used). The signs may be made consistent by finding the maximum deflection of the mode at the ith speed and then, multiplying the mode shape at speed i+1 by −1 if required so that it has the same sign as the mode at speed i. For complex modes, this step entails rotating (a.k.a. multiplying) the mode shape at the next, (i+1)th speed about the complex plane so that it has the same complex angle as the mode at speed i at a selected location along the shaft axis. The selected location may be the shaft axis location with the largest mode shape magnitude, and the complex angle at this location may be set to Real{1}. A suitable variation is to compare the complex angles at multiple shaft locations instead of just considering one location.

Figure 5D:
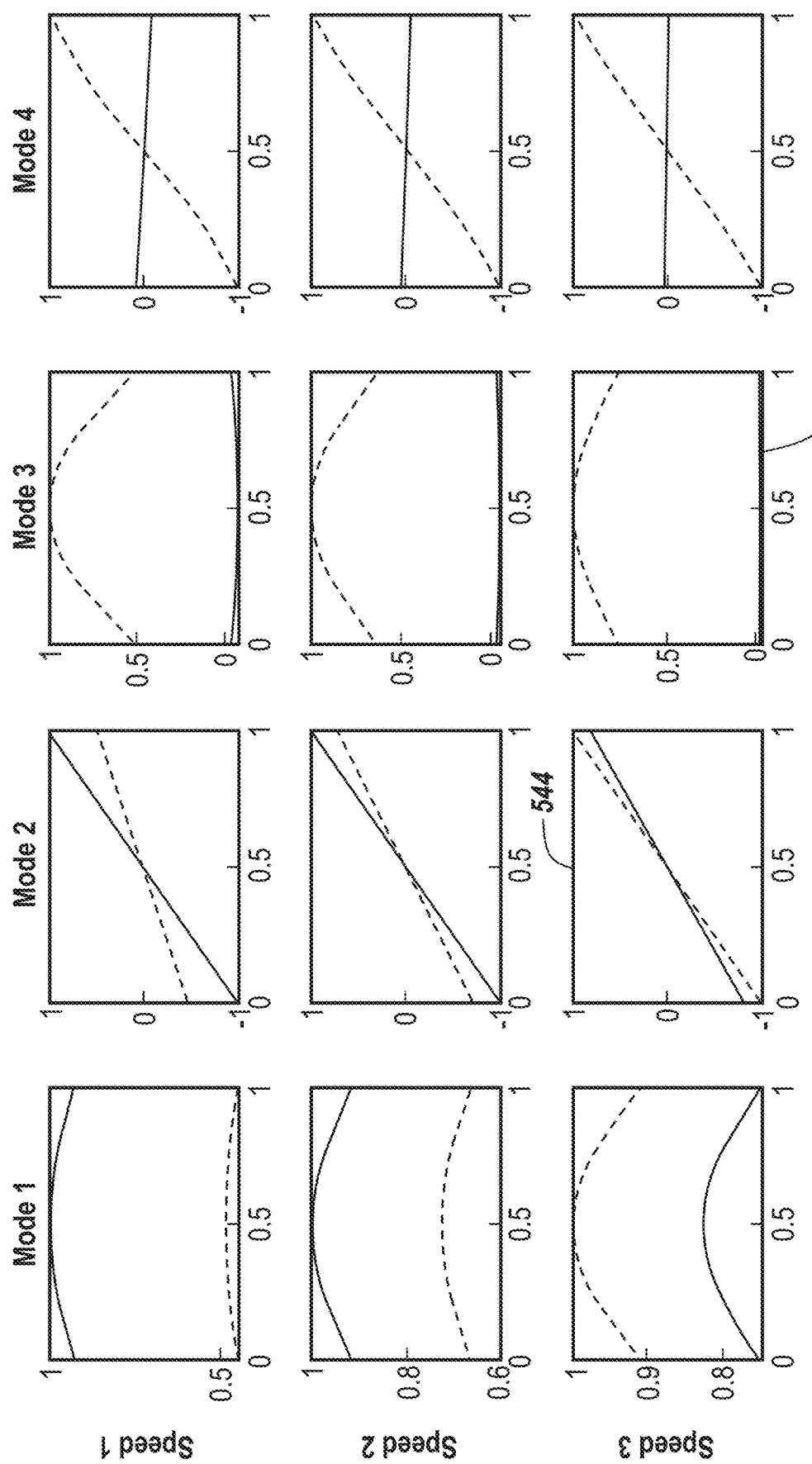
FIG. 5D depicts the modal shape plots of FIG. 5A after matching and after the plots are adjusted to ensure consistent mode signs for all parameter values.

FIG. 5D shows the resulting mode shape plots 540 for a normalized mode after the normalizing, matching, and ensuring of consistent signs have been performed. Note that mode shape 542 and 544 have been swapped to be associated with different modes (see plots 504 and 506 in FIG. 5A). In addition, note that plot 544 has been modified to have a consistent sign.

Referring again to FIG. 4A, when the modes have been matched with the parameter(s) values (404). The mode shapes or information related to the modal properties are stored in the data structures (406). In some exemplary embodiments, the following information may be stored in the data structures:

Modal forcing coefficient (the coefficient is multiplied by external time-dependent variables)
Modal stiffness
Modal damping
Modal gyroscopic damping (this may be optional because some models assume it is constant with rotation speed, but some models allow it to vary. There may be cases where it depends on temperature.)

Modal mass (this is optional because it is common to normalize each mode and its properties so that the mass of each mode is 1).

The data structures may take different forms. They may be any of a number of different data structures, such as records, lists or tables. The data structures may be human readable or only machine readable. In some exemplary embodiments, the data structures may be one or more lookup tables. Each look up table has entries indexed by parameter(s) values. There may be separate lookup tables for each mode or a single table may store values for multiple modes. FIG. 6 shows an example of a lookup table 600. The lookup table 600 is for a single mode. Entries 602, 604, 606, and 608 are indexed by speed. Each entry holds the modal properties information, such as identified above, for the given mode at the indexed speed. Hence, entry 602 holds the modal properties for speed S1.

Where more than one parameter is of interest, the lookup table may include additional dimensions for the additional parameters. In this case, Parameter 1 has parameter values P1, . . . , P5 and Parameter 2 has values P'1, P'2 and P'3. Each entry is indexed by a tuple {Parameter 1, Parameter 2}. Hence, the entry is indexed by the tuple {P1, P'1} and holds the modal properties for those parameter values.

As was mentioned above, the data structures are used in the simulation (406). For the example described in this document, the lookup tables are used to adjust the values of $M_{Modal}$, $B_{Modal}$, $K_{Modal}$, and $f_{Modal}$ as the rotor speed changes. The adjusted values are used in the equation of motion that is simulated:

$$M_{Modal}(\Omega)\ddot{\vec{\eta}} + (B_{Modal}(\Omega) + \Omega G_{Modal}(\Omega))\dot{\vec{\eta}} + (K_{Modal}(\Omega) + \dot{\Omega} G_{Modal}(\Omega))\vec{\eta} = \vec{f}_{Modal}(\Omega, t), \quad (9a)$$

Where $\Omega$ is the rotation speed, dot indicates a time-derivative, and the modal degrees of freedom, $\vec{\eta}$, relate to the node degrees of freedom, $\vec{x}$, by:

$$\vec{x} = H(\Omega)\vec{\eta} \quad (9b)$$

In equations (9a) and (9b), ($\Omega$) indicates a parameter that changes based on a lookup table output.

If the state-space formulation is used, then the simulation uses, $$\dot{\vec{\eta}} = \lambda(\Omega)\vec{\eta} + C_{Modal}(\Omega)\vec{f}_{Modal}(\Omega, t), \quad (10a)$$

The modal degrees of freedom, $\vec{\eta}$, relate to the node degrees of freedom, $\vec{y}$, by:

$$\vec{y} = H_{Right}(\Omega)\vec{\eta} \quad (10b)$$

In equations (10a) and (10b), (C) indicates a parameter that changes based on a lookup table output.

Initially, the one or more parameter values are used as indices to locate and look up modal properties associated with the eigenmode and the index parameter values. These modal properties are computed from the modal shape for the specified eigenmode associated with the index parameter values. The matrices described above can be stored as the eigenmode property information. The values held in the data structure for the breakpoints closest to the current parameter value can be accessed and interpolation can be performed between the values in the table based on the offset relative to the breakpoint to obtain the values used by the simulation to produce the transverse motion response for the shaft. In some implementations, only the modal properties information at the eigenfrequencies at the specified parameter intervals are stored in the data structures. As such, interpolation is used for parameter values that lie between the stored reference parameter values. The interpolation may be linear or non-linear and can be performed efficiently during simulation. In some implementations, the methods of interpolation can be specified by a user before simulation starts or can be chosen by the system. The values for the relevant modes for the discrete elements of the shaft of the rotor are obtained from the data structures and processed to compute the transverse motion response of the shaft of the rotor.

The conventional FEA approaches produce accurate results but are computationally expensive. The exemplary embodiments may produce results on par with such FEA approaches but much more quickly. In some instances, a more than tenfold gain in computational time savings may be realized.

Figure 7:
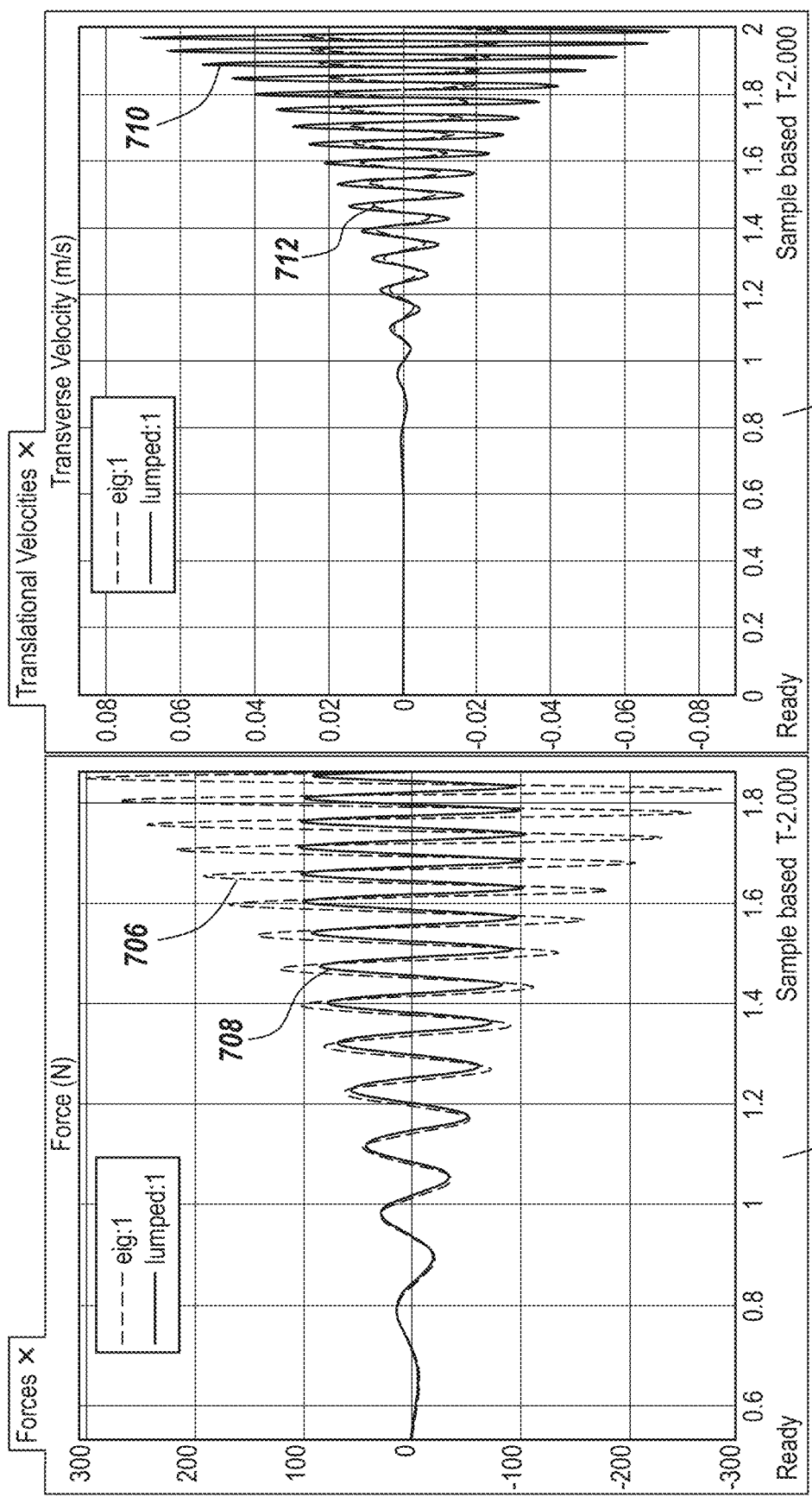
FIG. 7 depicts separate illustrative plots of force and translational velocities for a conventional finite element analysis (FEA) approach versus an approach where mode shapes across speeds are calculated without matching or normalization.

In order to understand the effects that the exemplary embodiments have on the desired accuracy of simulation of the transverse motion response of a rotor, it is helpful to review some illustrative plots output from simulating the model 200 of FIG. 2A in an environment 245 of FIG. 2B. FIG. 7 compares a conventional FEA approach for rotor 204 with a conventional eigenmode approach for rotor 202 using a lookup table holding modal properties where no mode matching has been performed and no efforts have been made to make the signs consistent. This depiction helps to illustrate some of the shortcomings of the conventional static eigenmodes approach. In particular, the conventional lumped mass FEA approach is accurate, but the conventional static eigenmode approach is not. FIG. 7 shows the response at a support of the rotor for such a case. Plot 700 shows Force versus Time for the support. The FEA response curve 708 differs from the eigenmode with a lookup table response curve 706. Plot 702 compares translational velocity with time and depicts the eigenmode with lookup table response curve 710 with the FEA response curve 712. In plot 702, there is an apparent difference in the response of the two approaches.

Figure 8:
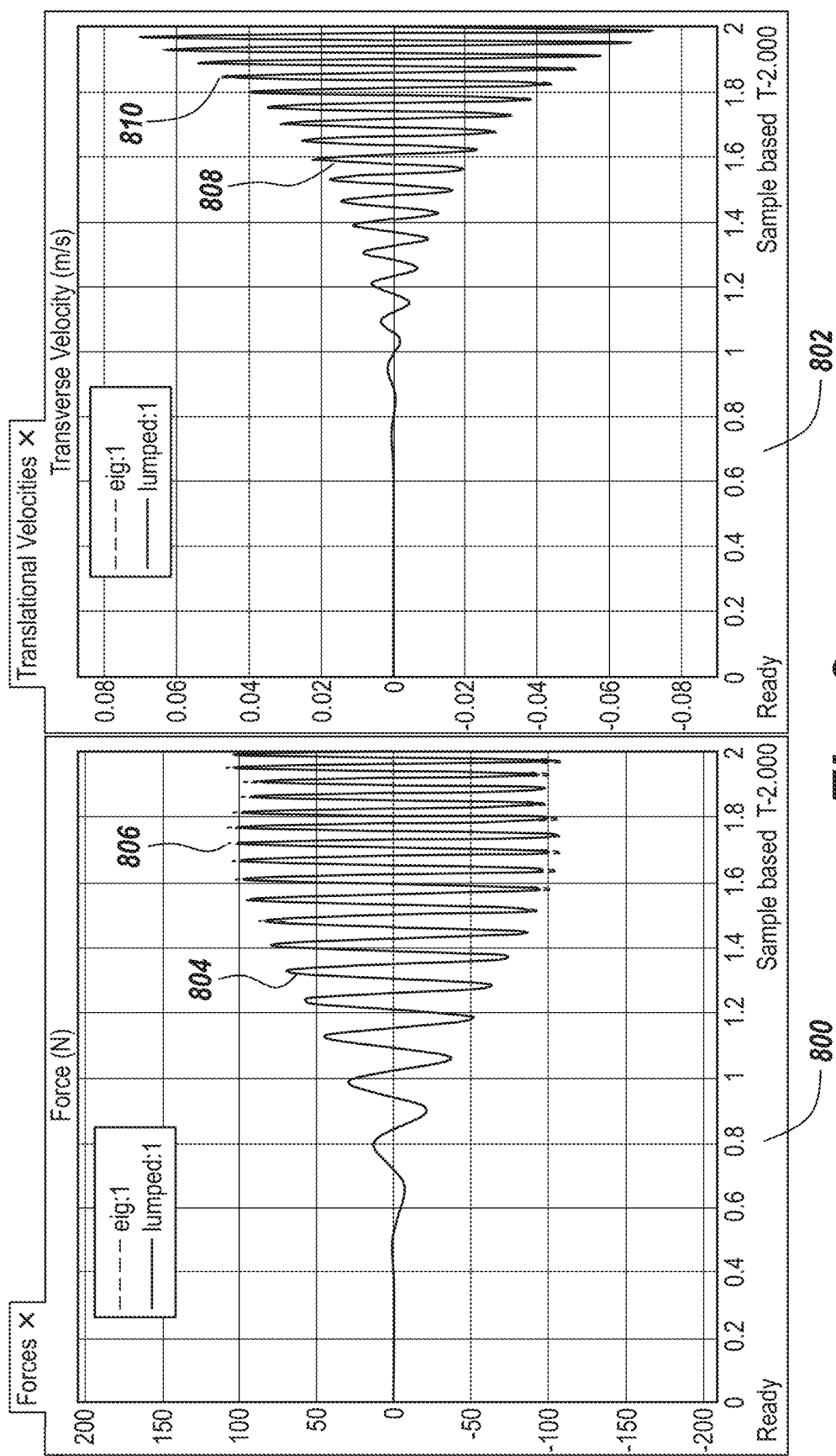
FIG. 8 depicts separate illustrative plots of force and translational velocity for a conventional FEA approach versus an approach of an exemplary embodiment.

FIG. 8 shows a comparison of an approach of an exemplary embodiment (where the matching and steps to provide sign consistency are performed unlike as in the approach of FIG. 7 for rotor shaft 202) versus the FEA approach. Plot 800 shows a curve 804 for the forces for the FEA approach of rotor 204 and a curve 806 for the exemplary embodiment of rotor 202. Plot 802 shows the translational velocity curve 808 for the FEA approach of rotor 204 versus the translational velocity curve 810 for the exemplary embodiment of rotor 202. FIG. 8 demonstrates that the dynamic eigenmodes approach of the exemplary embodiments produces results with comparable accuracy to the conventional FEA approach. However, as has been discussed above, the dynamic eigenmodes approach results in significant computational savings relative to the conventional FEA approach and as a result, may result in an improvement in simulation speed by a factor of 5 to 10.

One application of an exemplary embodiment is in a control system. The computed transverse motion response of the shaft of the rotor may be used by a controller to avoid, pass through, or damp certain eigenfrequencies that may produce higher levels of vibration, e.g., for car ride comfort. The invention helps simulate the vibration with higher computational efficiency. Higher computational efficiency allows faster design development of the rotor shaft, controller, or other machine components. That is, faster testing of the vibration in different scenarios and faster parameter optimization procedures. Alternatively, in some applications, a party may wish to enhance vibration, in which case the controller would seek to obtain the response with greatest vibration, e.g., for vibration transporters of small parts or soil, and hence would seek out certain eigenfrequencies.

Figure 9:
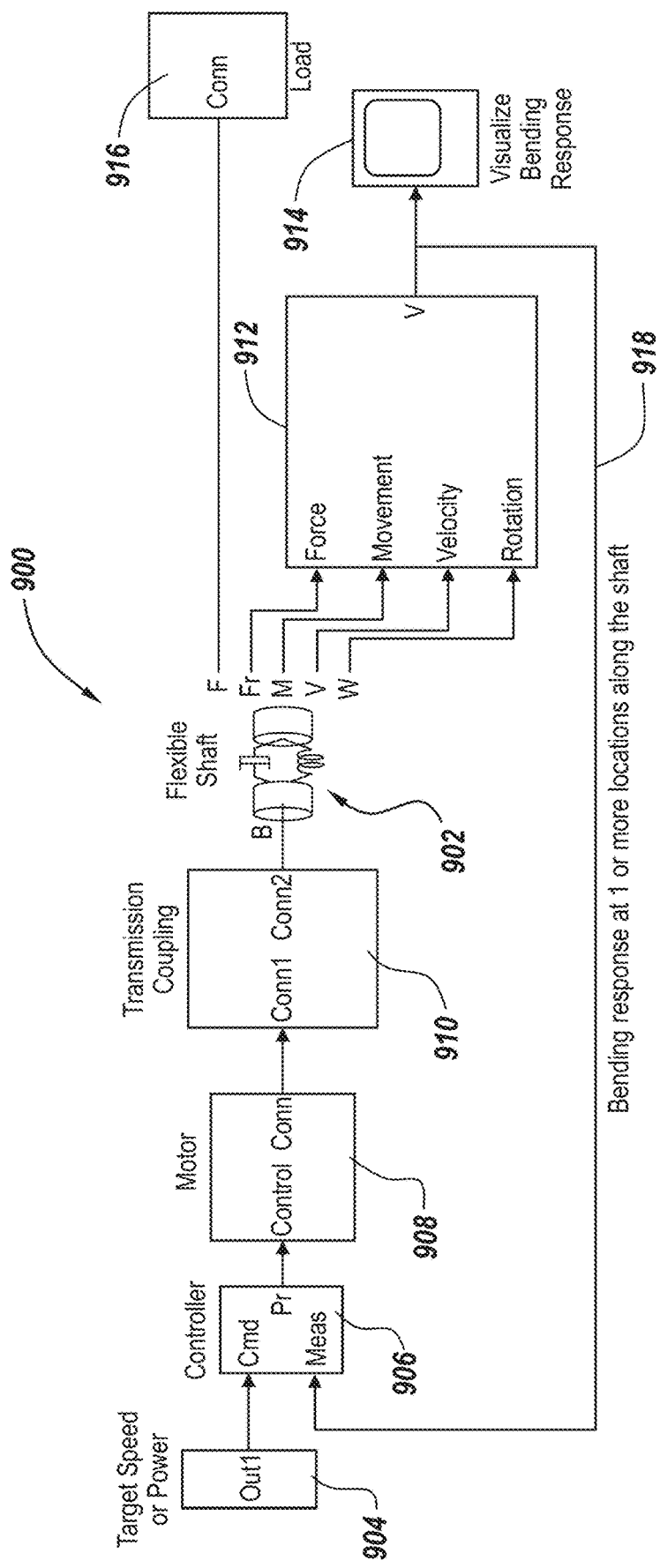
FIG. 9 depicts an illustrative block diagram for a system with a controller and a rotor.

FIG. 9 shows an illustrative block diagram model 900 of a portion of a mechanical system with a controller for a rotor. Such a mechanical system can be used in vehicles, e.g., cars, wind turbines, or airplanes. In this model 900, a target speed or power 904 is provided to a controller 906. The controller 906 provides a control input to a motor 908. The motor 908 is connected to a transmission coupling 910. The transmission coupling 910 is connected to a shaft of a rotor 902. The motor 908 drives the rotation of the rotor when engaged via the transmission coupling 910. The rotor 902 is coupled to a load 916. A sensor 912 gathers information regarding force, moment, velocity. and rotation of the rotor. This information may be passed back to the controller 906 via a feedback loop 918. The controller may adjust the operational parameters, such as speed, temperature, blade pitch, gear coupling, magnetic bearing force, or other parameters that affect the natural vibration frequencies of the rotor. A visualization of the bending transverse motion response of the flexible rotor shaft 902 may be output to block 914 for visualization.

The controller 906 controls the speed of the motor 908, which in turn controls the rotational speed of the rotor 902. For many rotors, the control system may adjust motor speed, motor torque, or transmission gears, that are driving the rotor, which would all ultimately adjust the rotation speed. For a turbine, the control system may adjust the pitch of blades attached to the rotor, which would change the rotation speed and may change properties of the rotor (which changes the resonant speeds). For a rotor with active magnetic bearings, adjusting the current or voltage through the magnetic bearing would adjust the bearing's effective stiffness and damping and/or adjust the "rigid tilt" mode of the rotor. In some instances, the control system may control damping of the rotor or other mechanism that affect the rotor. The sensor 912 is provided to detect information that is fed back to the control system 906. In FIG. 9, the sensor 912 feeds back a number of types of information to the controller 906.

To simulate the model 900, the simulation environment 245 can apply the methods described with reference to FIGS. 1-6 to generate info about the rotor/shaft 902. During simulation, the speed and other parameters of the flexible rotor shaft 902 change, and the stored info is used to determine the transverse motion response of the flexible rotor shaft 902 quickly and accurately. The controller 906 responds to the bending response of one or more locations along the shaft to achieve the goal of avoiding or minimizing vibrations, avoiding substantial transverse motion responses, or avoiding other unwanted behavior. The simulations can be used to predict or improve a machine's performance in which the flexible rotor shaft is present. The approaches of the exemplary embodiments described herein maintain the accuracy of the simulation results while substantially reducing the computational expense of performing the simulations. Prediction can be used to ensure that the performance is acceptable. The machine's performance may be improved by varying any geometric, material, or controller parameters of the rotor system. Good machine performance typically includes reduced, e.g., minimized damage of parts, passenger discomfort due to vibration, and audible noise.

Eigenfrequencies that are close to the rotor rotation speed are problematic because they are associated with large amount of vibration. Similarly, some eigenmode shapes associated with these eigenfrequencies are especially problematic if they cause large motion or stress at sensitive locations along the rotor. Eigenfrequencies may be identified using information stored in the data structures. For example, eigenfrequencies at associated parameter values which elicit a large transverse motion response may be identified. The controller feedback parameters may be adjusted, the targeted steady-state rotation speed may be adjusted, or other operational parameters may be adjusted to avoid or to quickly pass through such eigenfrequencies that are problematic. Rotor steady-state speed adjustment might occur in conjunction with changing the power transmission ratios so that the load 916 maintains a certain target steady-state rotation speed. Some controllers may sense a large amount of vibration and adjust the rotation speed in response. Other controllers may be designed to just avoid certain rotation speeds that have been identified as problematic for the reasons described above.

Figure 10A:
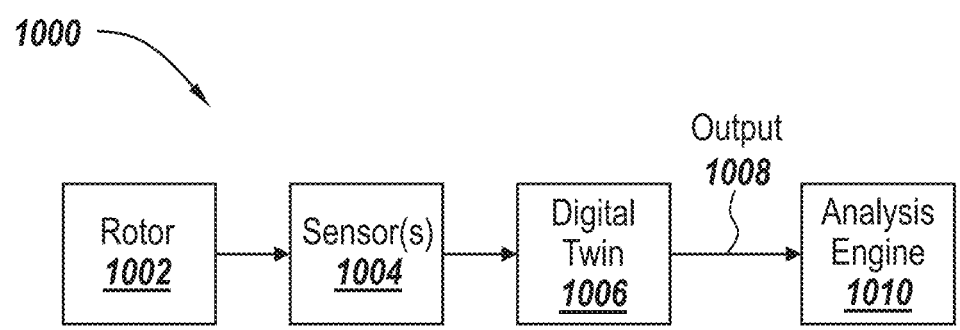
FIG. 10A depicts a block diagram illustrating use of a model as a digital twin of a rotor.

In another example, the disclosed embodiments can also be implemented with a digital twin. The model of the rotor described herein may be a digital twin of an actual rotor. FIG. 10A depicts a block diagram 1000 of use of such a digital twin. An actual rotor 1002 operates in a machine, e.g., a car, an airplane, or a wind turbine. One or more sensors 1004 gather information regarding the rotor 1002 as the rotor operates, and that information is provided to a digital twin 1006 modeling the rotor 1002. The digital twin 1006 can be realized through a model 200, such as described above, that simulates behavior of the rotor to attempt to exactly replicate or accurately approximate the rotor behavior. The digital twin may then provide output 1008 regarding the rotor. The output 1008 may include information such as the state of the rotor, status information, and operational information. The output 1008 may be passed to an analysis engine 1010 that processes the output to perform analysis, such as anticipated failure date, anticipated maintenance date, identification of problems, performance information, etc. The analysis engine may be realized as a processor that runs software to perform the analysis.

The input to the digital twin 1006 may be sensor data that indicates vibration at different locations on the rotor. System identification may be used to adjust the digital twin model parameters, if necessary, so that characteristics (frequencies and amplitudes) of the simulated vibrations match the sensor vibrations. The output of the digital twin 1006 may be a real-time simulation. Characteristics of the vibration are used to predict the health status of the machine and plan maintenance on it. It may be useful to know the mode shapes because the mode shapes of the vibration affect the amount of stress that is damaging the machine. The described exemplary embodiments may improve the model's computational efficiency, which is needed for the real-time simulation of a digital twin.

Figure 10B:
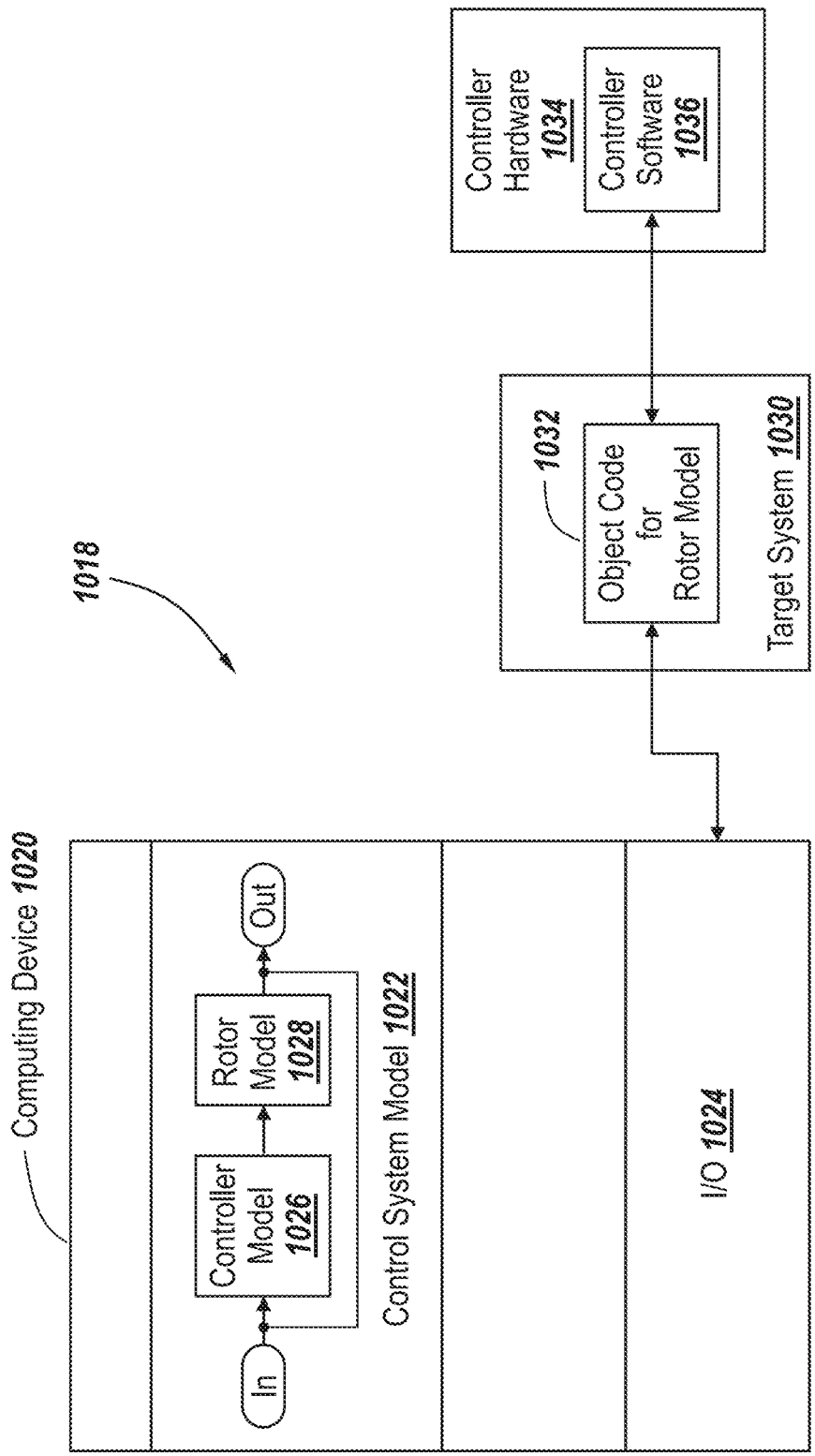
FIG. 10B depicts an illustrative hardware in the loop simulation arrangement for a rotor model for an exemplary embodiment.

The exemplary embodiment may also be helpful for "hardware in the loop" simulations for testing controller designs. FIG. 10B depicts a block diagram 1018 showing an example of components for a hardware in the loop simulation of a rotor model for an exemplary embodiment. A computing device 1020 runs a simulation of a control system model 1022 and has an input/output component 1024. The control system model 1022 includes a controller model 1026 and a rotor model 1028 for a rotor like those discussed above for exemplary embodiments. Object code 1032 generated from the rotor model is run on a target system 1030, such as an embedded system or target computing device. The object code 1032 is under the control of controller software 1036 running on controller hardware 1034.

The controller model 1022 provides virtual inputs to the object code 1032 as the object code 1032 executes on the target device 1030 via the input/output component 1024 during simulation of the control system model 1022. The object code 1032 provides the functionality of the rotor model 1028 on the target system and uses the virtual inputs. The object code 1032 also provides outputs that are fed back to the control system model 1022. The object code 1032 is under the control of the controller software 1036.

Thus, the design of the controller software 1036 may be tested for controlling control parameters of the rotor. Based on the resulting behavior of the object code as fed back to the control system model 1022, the performance of the controller software 1036 may be observed and tested. Given the accuracy and speed of simulation provided by the dynamic eigenmode approach of the exemplary embodiments, the exemplary embodiments are well suited for use in such a hardware in the loop application.

Figure 11:
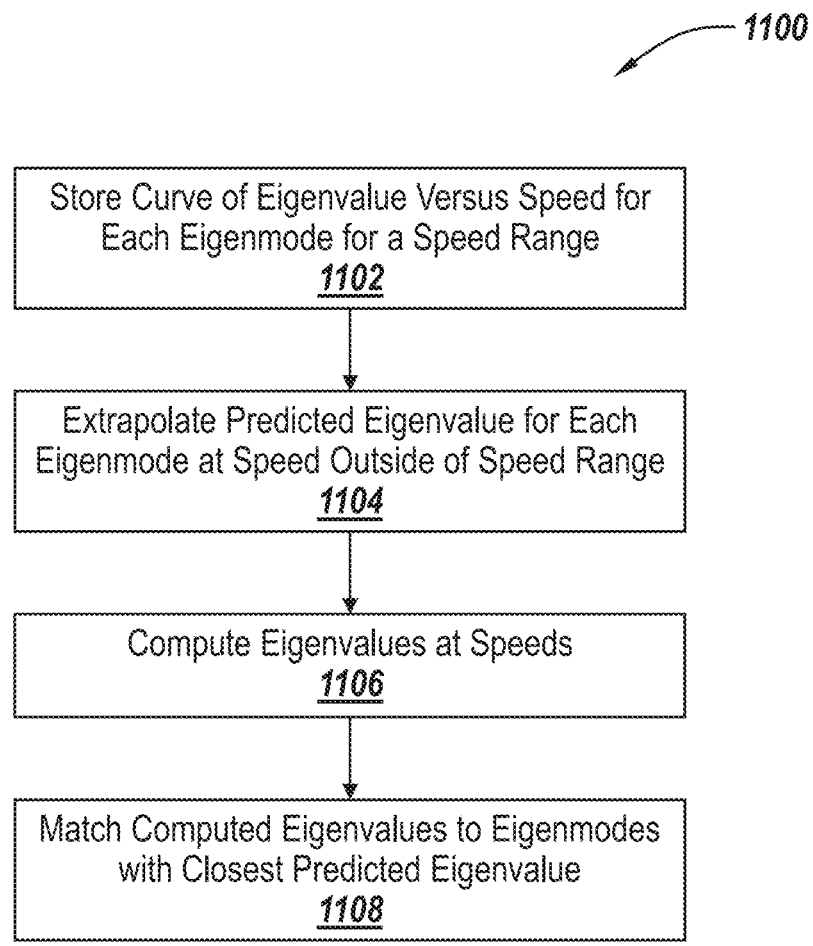
FIG. 11 depicts a flowchart illustrating an alternative approach of matching eigenmodes with speeds where curves of eigenvalues that have already been matched to eigenmodes and extrapolation are used to match eigenvalues at additional speeds to eigenmodes.

The above-description of the matching of eigenmodes to speeds implements an example approach in which correlation values were calculated and the correlation values were used by an iterative matching process to match eigenmodes to speeds (see 532 and 534 of FIG. 5C and the associated discussion above). There are alternatives to that approach. One example of the alternative approaches is shown in the flowchart 1100 of FIG. 11. Like in the approach described above, eigenvalues can be calculated for the different speeds or other parameter values across the eigenmodes, such as by using the eigs function of MATLAB, as described above. As explained previously, the sequence of eigenmodes may change over the speeds, such that an eigenvalue may not be the expected eigenmode at a given speed (see, e.g., FIG. 5B).

Figure 12:
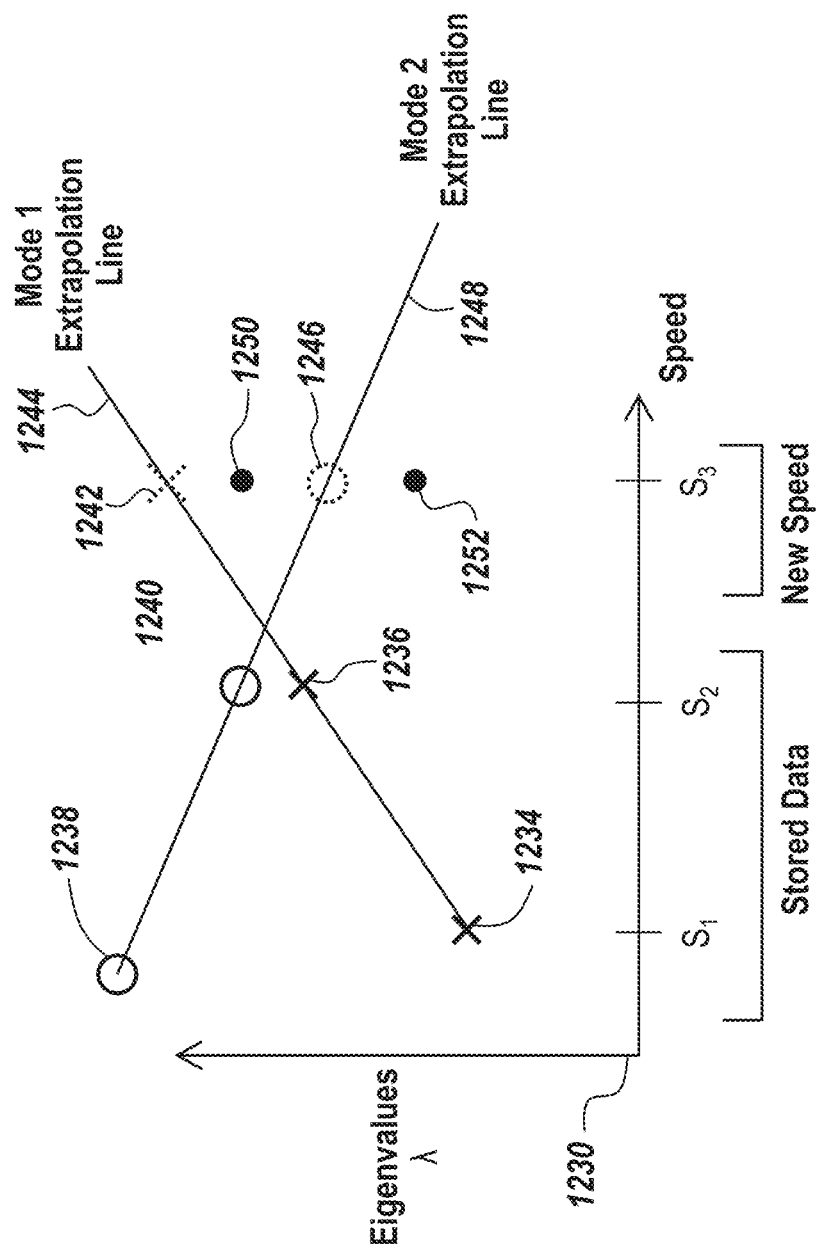
FIG. 12 shows an illustrative plot that helps to illustrate the process of FIG. 11.

In this example approach, the curves of eigenvalues versus speed are determined and stored for each eigenmode over a range of speeds where the eigenvalues don't cross eigenmodes (1102). FIG. 12 depicts an example plot 1230 of eigenvalues to speed for two eigenmodes that helps to illustrate the approach of the flowchart 1100 of FIG. 11. In this example of FIG. 12, the eigenvalues at speed S1 have already been matched to the eigenvalues at speed S2. Thus, eigenvalues 1234 and 1236 have been matched with eigenmode 1, and eigenvalues 1238 and 1240 have been matched with eigenmode 2. In this instance, the stored curves include the curve that extends between eigenvalues 1234 and 1236, and the curve that extends between eigenvalues 1238 and 1240.

The stored curve and its gradient are used to extrapolate a predicted eigenvalue of each mode at a speed slightly outside the initial speed range (1104). The initial speed range for the process of FIG. 11 may be any speed range where a crossing does not occur. "Slightly outside the initial speed range" can mean a range outside the initial range where there are no excessive crossings on non-linear trends between reference speeds. In FIG. 12, the extrapolated curve 1244 for eigenmode 1 passes through each stored eigenvalue 1234 and 1236 and extends past speed S3. In this instance, the curve 1244 is a line and a linear extrapolation may be used to locate predicted eigenvalue 1242 on the curve 1244 at speed S3. Likewise, the curve 1248 passing through eigenvalues 1238 and 1240 for eigenmode 2 may be extended via extrapolation. Predicted eigenvalue 1246 is on the curve 1248 at speed S3.

The eigenvalues are computed for the next speeds (1106). In the example case of FIG. 12, eigenvalues 1250 and 1252 are calculated for speed S3. The computed eigenvalues are then matched to the eigenmode with the closest predicted eigenvalue (1108). Another alternative is that if the extrapolation lines indicate that the ascending order of eigenvalues associated with distinct modes changes at speed S3 compared to speed S2, then the algorithm may adjust which computed eigenvalues/eigenmodes at speed S3 are matched to each eigenvalue/eigenmode at speed S2 to account for the crossing event. In the case of the example of FIG. 12, eigenvalue 1250 is closest to predicted eigenvalue 1242 and hence is matched with eigenmode 1, whereas eigenvalue 1252 is closest to predicted eigenvalue 1246 and is matched with eigenmode 2. This process may be repeated for successively extrapolated curves to match the eigenvalues to the eigenmodes for the speeds of interest. In this manner, the data structures may be built for use in the simulation as described above. The process may pick up with step 536 as described above.

Figure 13:
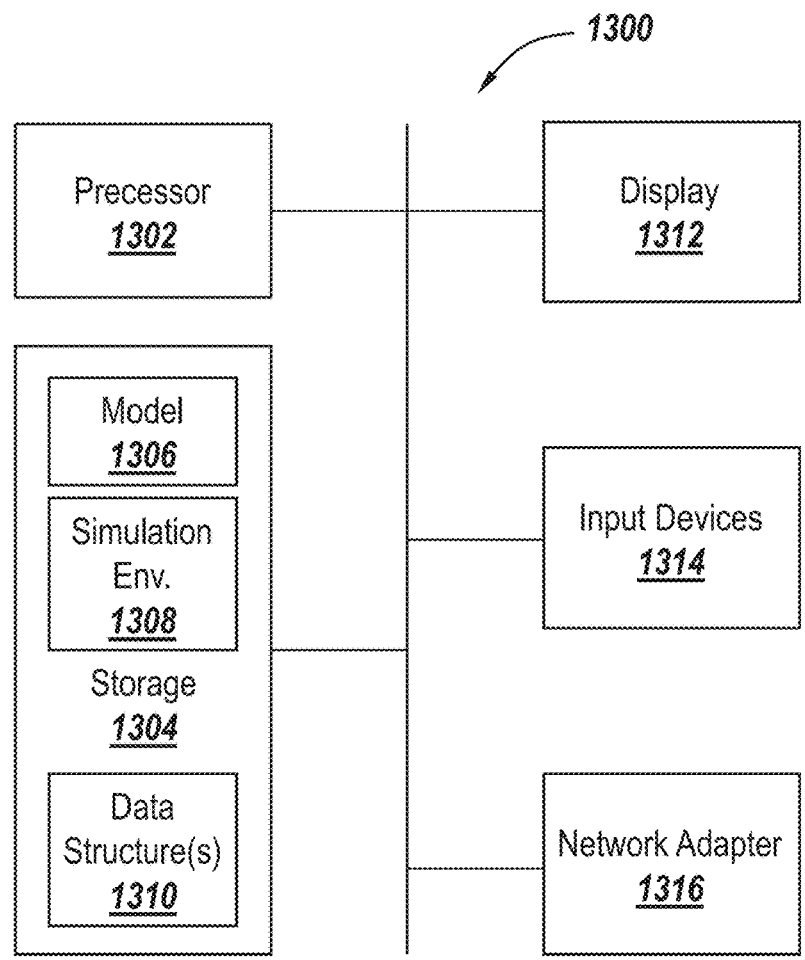
FIG. 13 depicts a block diagram of a computing device suitable for practicing an exemplary embodiment.

FIG. 13 depicts a block diagram of a computing device 1300 suitable for practicing an exemplary embodiment. The computing device 1300 may be a desktop computer, a laptop computer, a tablet computer, an embedded system, or other type of computing device. The computing device 1400 may include a processor 1302. The processor 1302 may be a central processing unit (CPU), a graphical processing unit (GPU), a field programmable gate array (FPGA), an application specific integrated circuit (ASIC), a controller, electronic circuitry or a combination thereof. The processor 1302 executes instructions to realize the functionality of the exemplary embodiments described herein. The processor 1302 has access to a storage 1304. The storage 1304 may be a magnetic storage device, an optical storage device or a combination thereof. The storage may include solid state storage, hard drives, removable storage elements such as magnetic disks, optical disks, thumb drives, or the like. The storage 1304 may include RAM, ROM, and other varieties of integrated circuit storage devices.

The storage 1304 may hold computer-executable instructions as well as data, documents, and the like. In FIG. 13 the storage 1304 is shown storing a simulatable or executable model 1306. The model 1306 may be a graphical model, a textual model or a combination thereof. The storage 1304 may include a simulation environment 1308, such as has been described above. The simulation environment 1308 may simulate the model 1306, and the functionality described above for the exemplary embodiments may be realized as part of the simulation environment 1308 and model 1306. The storage 1304 may also store the data structure(s) 1310 described above. The computing device 1300 may include a display device 1312 for displaying video output. Examples include LED displays, LCD displays and retinal displays. The computing device 1300 may include input devices 1314 such as a keyboard, mouse, microphone, scanner, pointing device or the like. The computing device 1300 may include a network adapter 1316 for interfacing the computing device with a network, such as a local area network or a network that provides access to a remote network like the Internet or another web-based network.

Figure 14:
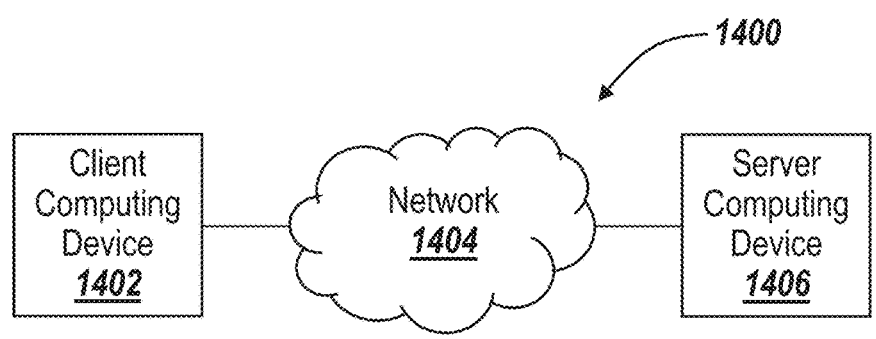
FIG. 14 depicts a distributed environment suitable for practicing an exemplary embodiment.

FIG. 14 depicts an illustrative distributed environment 1400 suitable for practicing exemplary embodiments. A client computing device 1402 is interfaced with a network 1404, such as a wide area network like the Internet, that is also interfaced with a server computing device 1404. The client computing device 1402 may include client code or a web browser for communicating with the server computing device 1404. For example, the simulation environment may run on the server computing device and a client on the client computing device 1402 may request that server computing device 1406 simulate the model and return the results. The model may include a modeled representation of a rotor and the approach like that discussed above for the exemplary embodiments may be used to determine the transverse motion response of a shaft of a rotor in the model. The server computing device 1406 may have a form like that shown in FIG. 13. The client computing device 1402 may have components like that shown in FIG. 13.

While the present invention has been described with reference to exemplary embodiments herein, it should be appreciated that various changes in form and detail may be made without departing from the intended scope of the present invention as defined in the appended claims.

The invention claimed is:

1. A method performed by a computing device, comprising:
receiving computed mode shapes of eigenmodes for a model of a rotor for values of a parameter that affects mode shape of the rotor;
matching the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
storing modal properties relating to the matched mode shapes regarding the selected eigenmodes at the matched values of the parameter; and
executing the model, wherein the executing comprises simulating the transverse motion response of the rotor for a selected value of the parameter by using the stored modal properties for the selected value of the parameter, updating the parameter to a new value and simulating the transverse motion response of the rotor for the new value of the parameter by using the stored modal properties for the new value of the parameter.

2. The method of claim 1, wherein the modal properties are stored in at least one lookup table.

3. The method of claim 1, wherein the using the stored modal properties comprises calculating an interpolated value for the mode shape from the stored modal properties and using the interpolated value in the simulation to determine the system response to the operating conditions.

4. The method of claim 1, wherein the parameter is one of speed of rotation of the rotor, ambient temperature around the rotor, temperature of the rotor, temperature of a bearing positioned around the rotor, blade pitch, or other controlled setting for a rotor shaft.

5. The method of claim 1, further comprising computing or receiving the mode shapes of the eigenmodes for the model.

6. The method of claim 1, further comprising normalizing the mode shapes and wherein the received mode shapes are the normalized mode shapes.

7. The method of claim 1, further comprising adjusting the signs of the mode shapes such that the mode shapes all have the same sign at a chosen location or weighted average sign at multiple chosen locations.

8. The method of claim 1, wherein the model includes a controller and wherein the controller adjusts one or more operational parameters of the model in response to the transverse motion response of the rotor.

9. The method of claim 8, wherein the controller adjusts the one or more operational parameters to avoid or accelerate through certain rotational speeds of the rotor.

10. The method of claim 1, wherein the model acts as a digital twin of an actual rotor and receives input regarding the actual rotor from a sensor interfaced with the actual rotor and passes simulation results from the model to an analysis engine for analysis.

11. The method of claim 1, wherein the model is deployed in a hardware in the loop arrangement for testing a controller for the rotor.

12. A non-transitory computer-readable storage medium storing instructions that cause a processor of a computing device to perform the following:
receive computed mode shapes of eigenmodes for a model of a rotor-for values of a parameter that affects mode shape of the rotor;
match the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
store modal properties relating to matched mode shapes regarding the selected eigenmodes at the matched values of the parameter; and
execute the model, wherein the executing comprises simulating the transverse motion response of the shaft of the rotor for a value of the parameter by using the stored modal properties for the value of the parameter, updating the parameter to a new value and simulating the transverse motion response of the rotor for the new value of the parameter by using the stored modal properties for the new value of the parameter.

13. The non-transitory computer-readable storage medium of claim 12, wherein using the modal properties comprises calculating an interpolated value for the mode shape from the stored modal properties and using the interpolated value in the simulation to determine the system response to the operating conditions.

14. The non-transitory computer-readable storage medium of claim 12, wherein the parameter is one of speed of rotation of the rotor, ambient temperature around the rotor, temperature of the rotor, temperature of a bearing positioned around the rotor, blade pitch or other controlled setting of a shaft of the rotor.

15. The non-transitory computer-readable storage medium of claim 12, further storing instructions for adjusting the signs of the mode shapes such that the mode shapes all have the same sign at a chosen location or weighted average sign at multiple chosen locations.

16. The non-transitory computer-readable storage medium of claim 12, wherein the model includes a controller and wherein the controller adjusts one or more operational parameters of the model in response to the transverse motion response of the rotor.

17. The non-transitory computer-readable storage medium of claim 12, wherein the model acts as a digital twin of an actual rotor and receives input regarding the actual rotor from a sensor interfaced with the actual rotor and passes simulation results from the model to an analysis engine for analysis.

18. The non-transitory computer-readable storage medium of claim 12, wherein the model is deployed in a hardware in the loop arrangement for testing a controller for the rotor.

19. A computing device, comprising:
a storage; and
a processor configured to:
determine a transverse motion response of a rotor by simulating a model of the rotor by:
receiving computed mode shapes of eigenmodes for the model of a rotor for values of a parameter that affects modal shape of the rotor;
matching the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
storing modal properties relating to matched mode shapes regarding the selected eigenmodes at the matched values of the parameter in the storage;
executing the model, wherein the executing comprises simulating the transverse motion response of the rotor for a value of the parameter by using the stored modal properties for the value of the parameter, updating the parameter to a new value and simulating the transverse motion response of the shaft of the rotor for the new value by using the stored modal properties for the new value of the parameter;
based on the determined transverse motion response of the rotor, identify at least one eigenfrequency; and
configure a control system for the rotor to avoid, damp or quickly pass through the identified at least one eigenfrequency.

20. A method performed by a computing device, comprising:
determining a transverse motion response of a rotor by simulating a model of the rotor by:
receiving computed mode shapes of eigenmodes for the model of a rotor for values of a parameter that affects modal shape of the rotor;
matching the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
storing modal properties relating to matched mode shapes regarding the selected eigenmodes at the matched values of the parameter;
executing the model, wherein the executing comprises simulating the transverse motion response of the shaft of the rotor for a value of the parameter by using the stored modal properties for the value of the parameter, updating the parameter to a new value and simulating the transverse motion response of the rotor for the new value by using the stored modal properties for the new value of the parameter;
based on the determined transverse motion response of the rotor, identifying at least one eigenfrequency; and
configuring a control system for the rotor to avoid, damp or quickly pass through the identified at least one eigenfrequency.

21. The method of claim 20, wherein the using the stored modal properties comprises calculating an interpolated value for the mode shape from the stored modal properties and using the interpolated value in the simulation to determine the system response to the operating conditions.

22. The method of claim 20, wherein the parameter is one of speed of rotation of the rotor, ambient temperature around the rotor, temperature of the rotor, temperature of a bearing positioned around the rotor, blade pitch, or other controlled setting for a rotor shaft.

23. The method of claim 20, further comprising adjusting the signs of the mode shapes such that the mode shapes all have the same sign at a chosen location or weighted average sign at multiple chosen locations.

24. A non-transitory computer-readable storage medium storing instructions that cause a processor of a computing device to perform the following:
determine a transverse motion response of a rotor by simulating a model of the rotor by:
receiving computed mode shapes of eigenmodes for the model of a rotor for values of a parameter that affects modal shape of the rotor;
matching the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
storing modal properties relating to matched mode shapes regarding the selected eigenmodes at the matched values of the parameter;
executing the model, wherein the executing comprises simulating the transverse motion response of the rotor for a value of the parameter by using the stored modal properties for the value of the parameter, updating the parameter to a new value and simulating the transverse motion response of the shaft of the rotor for the new value by using the stored modal properties for the new value of the parameter;

based on the determined transverse motion response of the rotor, identify at least one eigenfrequency; and configure a control system for the rotor to avoid, damp or quickly pass through the identified at least one eigenfrequency.

25. The non-transitory computer-readable storage medium of claim 24, wherein the using the stored modal properties comprises calculating an interpolated value for the mode shape from the stored modal properties and using the interpolated value in the simulation to determine the system response to the operating conditions.

26. The non-transitory computer-readable storage medium of claim 24, wherein the parameter is one of speed of rotation of the rotor, ambient temperature around the rotor, temperature of the rotor, temperature of a bearing positioned around the rotor, blade pitch, or other controlled setting for a rotor shaft.

27. A computing device, comprising:
a storage; and
a processor configured for:
receiving computed mode shapes of eigenmodes for a model of a rotor for values of a parameter that affects mode shape of the rotor;
matching the computed mode shapes with at least selected ones of the eigenmodes and the values of the parameter, wherein the matching comprises:
for at least selected ones of the eigenmodes at a given value of the parameter, generating a correlation metric between a computed mode shape for the selected eigenmodes at the given value of the parameter and one or more computed mode shapes at a previous or next value of the parameter in a sequence of values for the parameter;
for at least selected ones of the computed mode shapes, using the correlation metrics to match each selected computed mode shape with one of the selected eigenmodes and one of the values of the parameter;
storing modal properties relating to the matched mode shapes regarding the selected eigenmodes at the matched values of the parameter in the storage; and
executing the model, wherein the executing comprises simulating the transverse motion response of the rotor for a selected value of the parameter by using the stored modal properties for the selected value of the parameter, updating the parameter to a new value and simulating the transverse motion response of the rotor for the new value of the parameter by using the stored modal properties for the new value of the parameter.

28. The computing device of claim 27, wherein the model acts as a digital twin of the rotor and receives input regarding the rotor from a sensor interfaced with the rotor and passes simulation results from the model to an analysis engine for analysis.

29. The computing device of claim 27, wherein the model is deployed in a hardware in the loop arrangement for testing a controller for the rotor.

30. The computing device of claim 27, wherein the using the stored modal properties comprises calculating an interpolated value for the mode shape from the stored modal properties and using the interpolated value in the simulation to determine the system response to the operating conditions.

31. The computing device of claim 27, wherein the parameter is one of speed of rotation of the rotor, ambient temperature around the rotor, temperature of the rotor, temperature of a bearing positioned around the rotor, blade pitch, or other controlled setting for a rotor shaft.

* * * * *

UNITED STATES PATENT AND TRADEMARK OFFICE
CERTIFICATE OF CORRECTION

PATENT NO. : 11,409,249 B1  
APPLICATION NO. : 16/776797  
DATED : August 9, 2022  
INVENTOR(S) : Martin Udengaard and Jocelyn Kluger Page 1 of 1

It is certified that error appears in the above-identified patent and that said Letters Patent is hereby corrected as shown below:

On the Title Page

Item (54) the title and in the Specification Column 1, Lines 1-4; Please replace "SIMULATING TRANSVERSE MOTION RESPONSE OF A FLEXIBLE ROTOR BASED ON A PARAMETER DEPENDENT EIGENMODES" with --SIMULATING TRANSVERSE MOTION RESPONSE OF A FLEXIBLE ROTOR BASED ON PARAMETER DEPENDENT EIGENMODES--

In the Drawings

Sheet 21, Fig. 13, above the reference numeral 1302 please replace "Precessor" with --Processor--

In the Specification

Column 10, Line 58; Equation 1; Please replace "$M\ddot{\vec{x}} + (B(\Omega) + \Omega G(\Omega))\dot{\vec{x}} + (K(\Omega) + \dot{\Omega} G(\Omega))\vec{x} = \vec{f}(\Omega, \phi),$" with --$M\ddot{\vec{x}} + (B(\Omega) + \Omega G(\Omega))\dot{\vec{x}} + (K(\Omega) + \dot{\Omega} G(\Omega))\vec{x} = \vec{f}(\Omega, \phi).$--

Column 12, Line 22; Please replace "H_fight" with --H_right--

Column 12, Line 25; Please replace "H_fight" with --H_right--

Column 14, Line 10; Table heading; Please replace "Fmodal_lowest_4_nodes(:, :, 2)" with --Fmodal_lowest_4_modes(:, :, 2)--

Column 14, Line 19; Table heading; Please replace "Fmodal_lowest_4_nodes(:, :, 3)" with --Fmodal_lowest_4_modes(:, :, 3)--

Column 19, Line 66; Please replace "because they are associated with large" with --because they are associated with a large--

Signed and Sealed this  
First Day of November, 2022

Katherine Kelly Vidal  
*Director of the United States Patent and Trademark Office*